United States Patent
Castiglia et al.

(10) Patent No.: US 10,193,310 B2
(45) Date of Patent: Jan. 29, 2019

(54) LOW POWER EDGE-EMITTING LASER DIODE AND LASER DIODE MODULE

(71) Applicant: EXALOS AG, Schlieren (CH)

(72) Inventors: Antonino Francesco Castiglia, Schlieren (CH); Marco Rossetti, Schlieren (CH); Marcus Dülk, Schlieren (CH); Christian Velez, Schlieren (CH)

(73) Assignee: EXALOS AG, Schlieren (CH)

( * ) Notice: Subject to any disclaimer, the term of this patent is extended or adjusted under 35 U.S.C. 154(b) by 243 days.

(21) Appl. No.: 15/283,410

(22) Filed: Oct. 2, 2016

(65) Prior Publication Data

US 2018/0083422 A1 Mar. 22, 2018

(30) Foreign Application Priority Data

Sep. 3, 2016 (GB) .................. 1614980.9

(51) Int. Cl.
*H01S 5/40* (2006.01)
*G02B 27/01* (2006.01)
(Continued)

(52) U.S. Cl.
CPC ........ *H01S 5/4093* (2013.01); *G02B 27/0172* (2013.01); *H01S 5/1039* (2013.01);
(Continued)

(58) Field of Classification Search
CPC .. H01S 5/4093; H01S 5/32341; H01S 5/1039; H01S 5/4031; H01S 5/22;
(Continued)

(56) References Cited

U.S. PATENT DOCUMENTS 8,971,368 B1 3/2015 Raring et al.
2002/0030200 A1 3/2002 Yamaguchi et al.
(Continued)

FOREIGN PATENT DOCUMENTS

JP 3235778 7/1997

OTHER PUBLICATIONS

Yoshizumi et al, Continuous-Wave Operation of 520 nm Green InGaN-Based Laser Diodes on Semi-polar {2021} GaN Substrates, Applied Physics Express 2 (2009), 092101-1-3. The Japan Society of Applied Physics.

*Primary Examiner* — Yuanda Zhang

(57) ABSTRACT

A low power, side-emitting semiconductor laser diode is provided. The laser diode is formed from a semiconductor heterostructure having an active layer sandwiched between an n-type layer and a p-type layer, wherein the active layer forms a gain medium of width W. Front and back reflectors of reflectivity Rf and Rb are arranged on opposing side facets of the semiconductor heterostructure part to form a cavity of length L containing at least a part of the active layer which thus forms the gain medium for the laser diode, the gain medium having an internal loss αi. To achieve stable, low power operation close to threshold, the laser diode is configured with the following parameter combination: width W: 1 μm≤W≤2 μm; cavity length L: 100 μm≤L≤600 μm; internal loss αi: 0 cm$^{-1}$≤αi≤30 cm$^{-1}$; back reflectivity Rb: 100≥Rb≥80%; and front reflectivity Rf: 100≥Rf≥60%.

23 Claims, 19 Drawing Sheets

(51) Int. Cl.
  *H01S 5/22*     (2006.01)
  *H01S 5/323*    (2006.01)
  *H04N 9/31*     (2006.01)
  *H01S 5/10*     (2006.01)
  *H01S 5/32*     (2006.01)

(52) U.S. Cl.
  CPC ............ *H01S 5/22* (2013.01); *H01S 5/32341* (2013.01); *H01S 5/4031* (2013.01); *H04N 9/3129* (2013.01); *H04N 9/3161* (2013.01); *H04N 9/3164* (2013.01); *G02B 2027/0134* (2013.01); *G02B 2027/0178* (2013.01); *H01S 5/3202* (2013.01); *H01S 5/32333* (2013.01)

(58) Field of Classification Search
  CPC ............... H01S 5/3202; H01S 5/32333; G02B 27/0172; G02B 2027/0178; G02B 2027/0134; H04N 9/3161; H04N 9/3164; H04N 9/3129
  See application file for complete search history.

(56) References Cited

U.S. PATENT DOCUMENTS

| | | |
|---|---|---|
| 2011/0064100 A1 | 3/2011 | Raring et al. |
| 2013/0321891 A1 | 12/2013 | Ishida et al. |
| 2015/0103404 A1 | 4/2015 | Rudy et al. |
| 2015/0146752 A1 | 5/2015 | Ikegami |

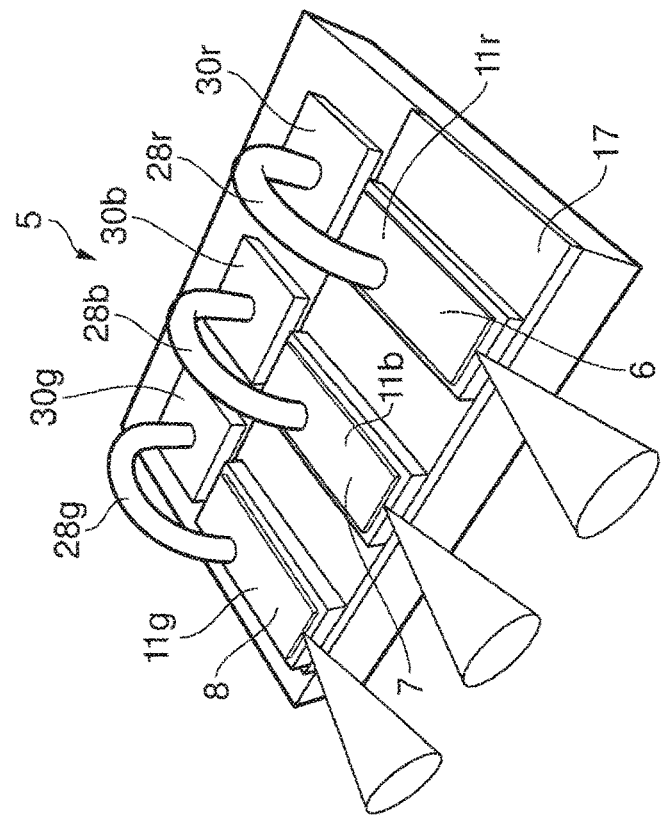
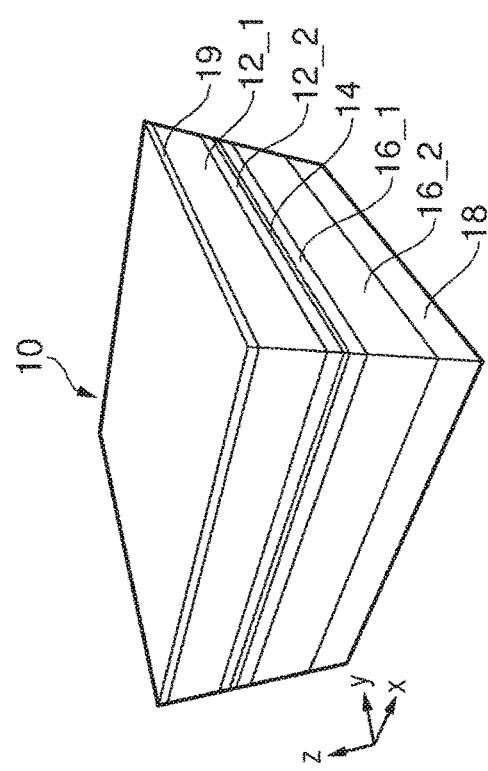

LOW POWER EDGE-EMITTING LASER DIODE AND LASER DIODE MODULE

CROSS-REFERENCE TO RELATED APPLICATIONS

This application claims the benefit of earlier filing date and right of priority to United Kingdom Patent Application No. GB 1614980.9 filed on 3 Sep. 2016, the contents of which are hereby incorporated by reference herein in their entirety.

FIELD OF THE INVENTION

The invention relates to low power edge-emitting semiconductor laser diodes and to a light module incorporating such laser diodes.

BACKGROUND

Semiconductor laser diodes (LDs) are well known sources for visible light in the red, green and blue (RGB), and are often combined in an RGB-module to make a color source.

In recent decades, the main thrust of the development of LDs and related light emitting diodes (LEDs) has been to refine the design of blue and green LDs (and white light emitters) around the gallium nitride materials system, GaAlInN, so that green and blue emitters are available to complement the red emitters that were developed earlier around the GaAlInAsP materials system. Important areas of the development have been to increase power, efficiency, lifetime and reliability. Efficiency is commonly stated as wall plug efficiency (WPE) which is the ratio of output optical energy to input electrical energy.

More recently, interest in direct retinal projection has increased for virtual reality and augmented reality applications. It is envisaged that an RGB projection source is incorporated into glasses or a visor as wearable technology. In contrast to a classic projection system, or other applications such as lighting and welding, where high power is needed, for direct retinal projection low power is needed. However, conventional LDs have not traditionally been optimised with low power applications in mind, and tend to be relatively unstable when operated at low powers, since low power operation means operation close to threshold.

FIG. 1A is a graph of light output power L plotted against drive current I (so-called L-I characteristic) of a typical commercially available edge-emitting blue LD. As can be seen, the threshold drive current is about 25 mA and increasing the drive current from threshold up to about 100 mA produces output powers in the 0 to 100 mW range.

FIG. 1B shows the wall plug efficiency (WPE) in percent as a function of drive current for the same LD as FIG. 1A. The LD is quite inefficient close to threshold at about 25 mA and first becomes relatively efficient at higher drive currents, with a WPE of about 20% being attained at a drive current of 40 mA. WPE then increases more slowly and saturates at about 30%.

It can thus be appreciated that operating a conventional edge-emitting LD at low power close to threshold in the sub mW output range will generally result in a very inefficient and unstable operation. Power stability with temperature is a particular problem, with a power variation of 0.3 mW per degree Centigrade being typical.

US 2015/0103404 A1 relates to a design of virtual reality or augmented reality projection glasses. The glasses incorporate an RGB-module comprising red, green and blue LDs. For the blue LD, an edge-emitter is disclosed which is based on a ridge design with the ridge being parallel with the c-plane of a GaN crystal. Different examples have cavity front mirror reflectivities $R_f$ of: close to zero (no coating on output coupler facet); 50% and 75%. A range of cavity lengths of about 100 to 500 µm is considered. The ridge widths W are in the range 1-2 µm. The Rf=75% examples have cavity lengths L=30-80 µm in order to keep the WPE reasonably high. The Rf=50% examples permit the threshold current to be reduced to around 5 to 20 mA depending on the gain, albeit with reduced WPE. It is said that 'slope efficiency' $\eta_d$ must remain high to achieve favourable WPE, where 'slope efficiency' is the ratio of optical output power to input drive current.

BRIEF SUMMARY OF THE INVENTION

According to one aspect of the invention there is provided a side-emitting laser diode comprising a semiconductor heterostructure having an active layer sandwiched between an n-type layer and a p-type layer, wherein the active layer forms a gain medium of width W. The laser diode has a back reflector of reflectivity $R_b$ formed on a first side facet of the semiconductor heterostructure and a front reflector of reflectivity $R_f$ formed on a second side facet of the semiconductor heterostructure, wherein the front and back reflectors are spaced apart to form a cavity of length L containing at least a part of the active layer, which thus forms the gain medium with an internal loss $\alpha_i$.

The laser diode has the following combination of design parameters:
width W: $1 \text{ µm} \leq W \leq 2 \text{ µm}$;
cavity length L: $100 \text{ µm} \leq L \leq 600 \text{ µm}$;
internal loss $\alpha_i$: $0 \text{ cm}^{-1} \leq \alpha_i \leq 30 \text{ cm}^{-1}$;
back reflectivity $R_b$: $100 \geq R_b \geq 80\%$; and
front reflectivity $R_f$: $100 \geq R_f \geq 60\%$.

This particular combination of parameters results in a LD that can operate stably at low output powers.

In some embodiments, internal loss is kept as low as possible, i.e. as close as possible to zero. In other embodiments, internal loss is deliberately increased from its natural level by additional fabrication process, e.g. to increase scattering in the active layer or introduce an additional absorption loss in the laser diode structure, which may be achieved by doping, for example.

In certain embodiments, the back reflectivity $R_b$ is greater than one of 85%, 90% and 95%. In certain embodiments, the front reflectivity $R_f$ is greater than one of 65%, 70%, 75%, 80% and 85%.

In certain embodiments, the cavity length L is greater than one of 150 µm, 200 µm, 250 µm and 300 µm. In certain embodiments, the cavity length L is less than one of 400 µm, 450 µm, 500 µm and 550 µm.

In certain embodiments, the laser diode is configured to have a range of ratios of output optical power to input electrical power, referred to as wall plug efficiency, of between 0.5 and 1.5%. In certain embodiments, the laser diode is operable to emit, in particularly emit stably, with an output optical power below one of: 5 mW, 1 mW, 500 µW, 300 µW, 200 µW and 100 µW. In certain embodiments, the laser diode is operable to emit, in particularly emit stably at an output optical power from one of: 10 µW, 20 µW, 30 µW, 40 µW, 50 µW, 100 µW, 200 µW, 300 µW, 400 µW, 500 µW and 1 mW. The minimum output power at which such a laser diode will be able to operate will depend on the overall circumstances. In principle, the power stability of laser diodes embodying the invention can be improved without limit by increasing front mirror reflectivities Rf and/or internal losses, however in practice there will be some point at which these parameters may no longer be controllable. We expect stable operation in the tens of microwatt range to be practical. This contrasts with the lowest stable output power values possible for standard commercial laser diodes with a slope efficiency between 1 and 2 W/A, which is a few milliwatts, which implies a drive current of a few milliamperes above the threshold. For example, a typical power stability against temperature parameter for a commercial laser diode is about dP/dT=280 µW/C. This means that, if the required output power is 0.25 mW, a variation of 1° C. in temperature would lead to more than a 100% change of the output power, which would clearly be unacceptable for most applications. On the other hand, for an output power of 3 mW, the same temperature variation of 1° C. would lead to the conventional laser diode showing a 10% output power change, which might be acceptable.

In certain embodiments, the laser diode has a characteristic slope efficiency, in an output power range of up to 1 mW, of less than one of: 1.0, 0.8, 0.5 and 0.3 mW/mA, where slope efficiency is the ratio of output optical power to input electrical drive current.

In certain embodiments, the semiconductor heterostructure includes layers from the GaAlInN materials system or the GaAlInAsP materials system, in particular the active layer and the surrounding n-type and p-type layers. It will be understood that the GaAlInN materials system is suitable for blue and green, whereas the GaAlInAsP materials system is suitable for red.

The design can be used to fabricate emitters over a range of wavelengths spanning the ultraviolet to near infrared. However, for projection systems, the colors of principal interest are of course red, green and blue.

Laser diodes embodying the invention can be configured to emit in the blue, that is at a wavelength from 400-495 nm, or 450 to 495 nm. Specifically, a LD can be provided that is capable of delivering narrow blue light emission (center wavelength between 440 nm and 470 nm; <5 nm full width at half maximum).

Laser diodes embodying the invention can be configured to emit in the green, that is at a wavelength from 495-570 nm. Specifically, a LD can be provided that is capable of delivering narrow green light emission (center wavelength between 510 nm and 530 nm; <5 nm full width at half maximum).

Laser diodes embodying the invention can be configured to emit in the red, that is at a wavelength from 620-750 nm. Specifically, a LD can be provided that is capable of delivering narrow red light emission (center wavelength between 630 nm and 650 nm; <5 nm full width at half maximum).

The laser diodes can be operated continuous wave (CW) or pulsed.

Laser diodes embodying the invention are capable of delivering optical output powers from 10 µW to 5 mW and preferably below 1 mW and preferably below 500 µW.

Laser diodes embodying the invention can be operated with an electrical power consumption below 150 mW, and preferably below 100 mW, when operated in CW mode.

Laser diodes embodying the invention can provide stable light power levels, especially when operated close to the threshold current value.

Laser diodes embodying the invention can have excellent output power stability in relation to temperature variations.

According to another aspect of the invention there is provided a side-emitting ridge laser diode comprising:

a semiconductor heterostructure having an active layer sandwiched between an n-type layer and a p-type layer, wherein the active layer is influenced by a ridge structure to form a gain medium of width W;

a back reflector of reflectivity $R_b$ formed on a first side facet of the semiconductor heterostructure and a front reflector of reflectivity $R_f$ formed on a second side facet of the semiconductor heterostructure, wherein the front and back reflectors are spaced apart to form a cavity of length L containing at least a part of the active layer, which thus forms the gain medium with an internal loss $\alpha_i$;

wherein the width W: 1 µm≤W≤2 µm;

wherein the cavity length L: 100 µm≤L≤600 µm;

wherein the internal loss and the front and back reflectivities are selected with respective values to provide a characteristic slope efficiency, in an output power range of up to 1 mW, of less than one of: 1.0, 0.8, 0.5 and 0.3 mW/mA, where slope efficiency is the ratio of output optical power to input electrical current.

According to another aspect of the invention there is provided a light module comprising first and second laser diodes according to the above aspects of the invention and optionally also a third laser diode. For example, the first and second laser diodes, e.g. blue and green, may be side-emitting ridge LDs made out of the GaAlInN materials system and the third laser diode, e.g. red, may be a side-emitting ridge LD made from the GaAlInAsP materials system. Alternatively, a red emitter can be provided which is a VCSEL (i.e. not a design according to the LD of the invention). The red-emitting VCSEL could also be made from the GaAlInAsP materials system. The first, second and third laser diodes are configured to emit in respective colors, typically red, green and blue, which collectively provide a full color palette in an additive color model.

The light module is suitable for integration in a direct retina projection system requiring light to be scanned through a moving micro-mirror or optical fiber. The light module can be supplied in a sealed package with a specific gas atmosphere, or on a support element in ambient air. Various packaging options are possible, for example any of those disclosed in US 2015/0103404 A1, specifically FIGS. 12 to 22 thereof and supporting text. For example, the light beams from the LDs can be emitted directly to free space, or coupled out through suitable optical elements or combinations thereof, such as lenses, micro-optics, solid-state waveguides and/or optical fibers as desired.

According to another aspect of the invention there is provided a vision system, such as a pair of glasses, or a helmet with visor, configured to be placed on a human head incorporating a light module according to the above aspect of the invention.

BRIEF DESCRIPTION OF THE DRAWINGS

This invention will now be further described, by way of example only, with reference to the accompanying drawings.

FIG. 2 shows a semiconductor heterostructure suitable for a LD.

FIG. 4 is a schematic perspective view of an RGB light module incorporating red, green and blue LDs.

DETAILED DESCRIPTION OF THE PREFERRED EMBODIMENTS

FIG. 2 shows the basic structure 10 of the semiconductor layers which make up a semiconductor LD. The layers are an active layer 14 sandwiched between p-type layers 12_1 and 12_2 and an n-type layers 16_1 and 16_2, wherein this layered structure is grown on an n-type substrate 18 and topped by a p-type layer 19 to form a junction to a metallic top contact electrode. The p-type layers 12_1 and 12_2 comprise a top cladding layer 12_1 and thereunder a waveguide layer 12_2 adjacent the active layer 14. The n-type layers 16_1 and 16_2 comprise a waveguide layer 16_1 adjacent the active layer 14 and a bottom cladding layer 16_2 thereunder. The two waveguiding layers 12_2 and 16_1 have refractive indices lower than that of the active layer 14, so as to support at least one guided mode in the active layer 14. The different layers are made of different materials (heterostructure) to provide the desired band gap profiles and refractive index profiles, as well as other desired properties. The person skilled in the art will know that each of these layers will in fact most likely be made of multiple layers, for example the active layer 14 may be a multi-quantum well (MQW) heterostructure. Quantum dots or other reduced dimensional structures may also be incorporated. Further, additional layers, such as buffer layers between the substrate and other layers may be included.

Moreover, the order of the p-type and n-type layers can be reversed with respect to the substrate.

Figure 1A:
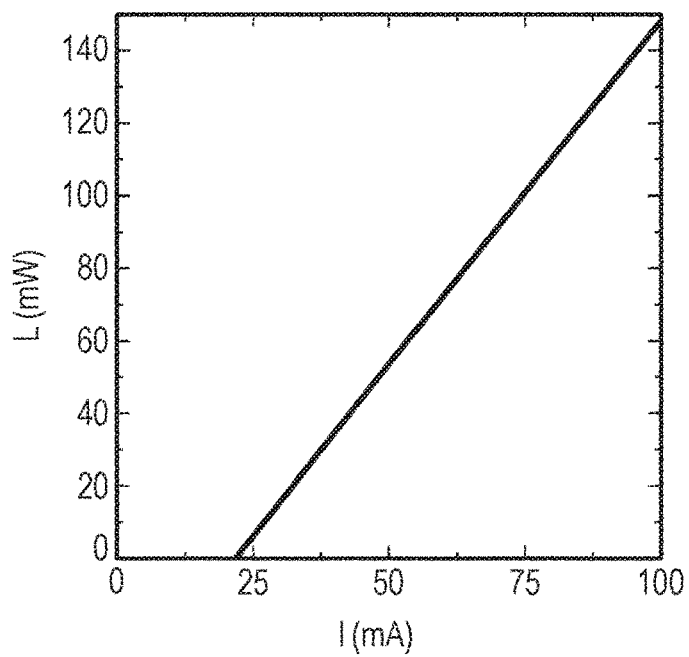
FIG. 1A shows a graph of light output power L vs. drive current I for a commercially available blue LD.
Figure 1B:
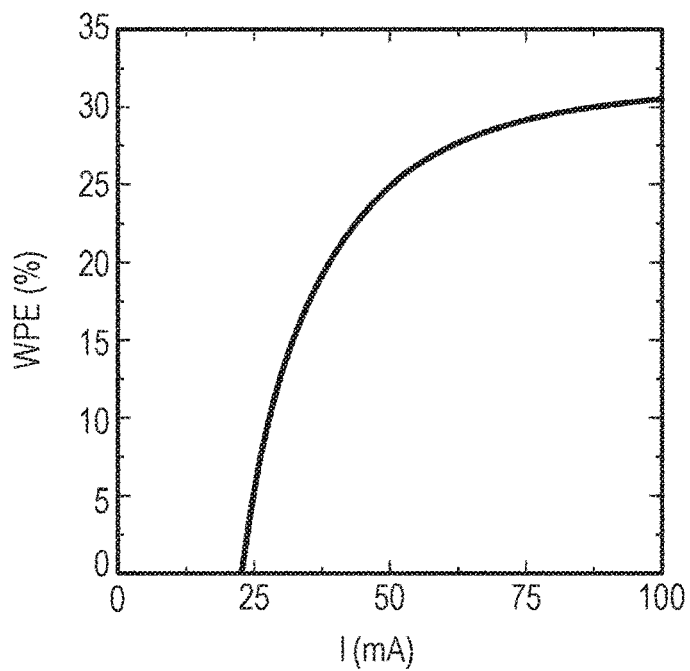
FIG. 1B shows wall plug efficiency WPE as a function of drive current I for the LD of FIG. 1A.
Figure 3:
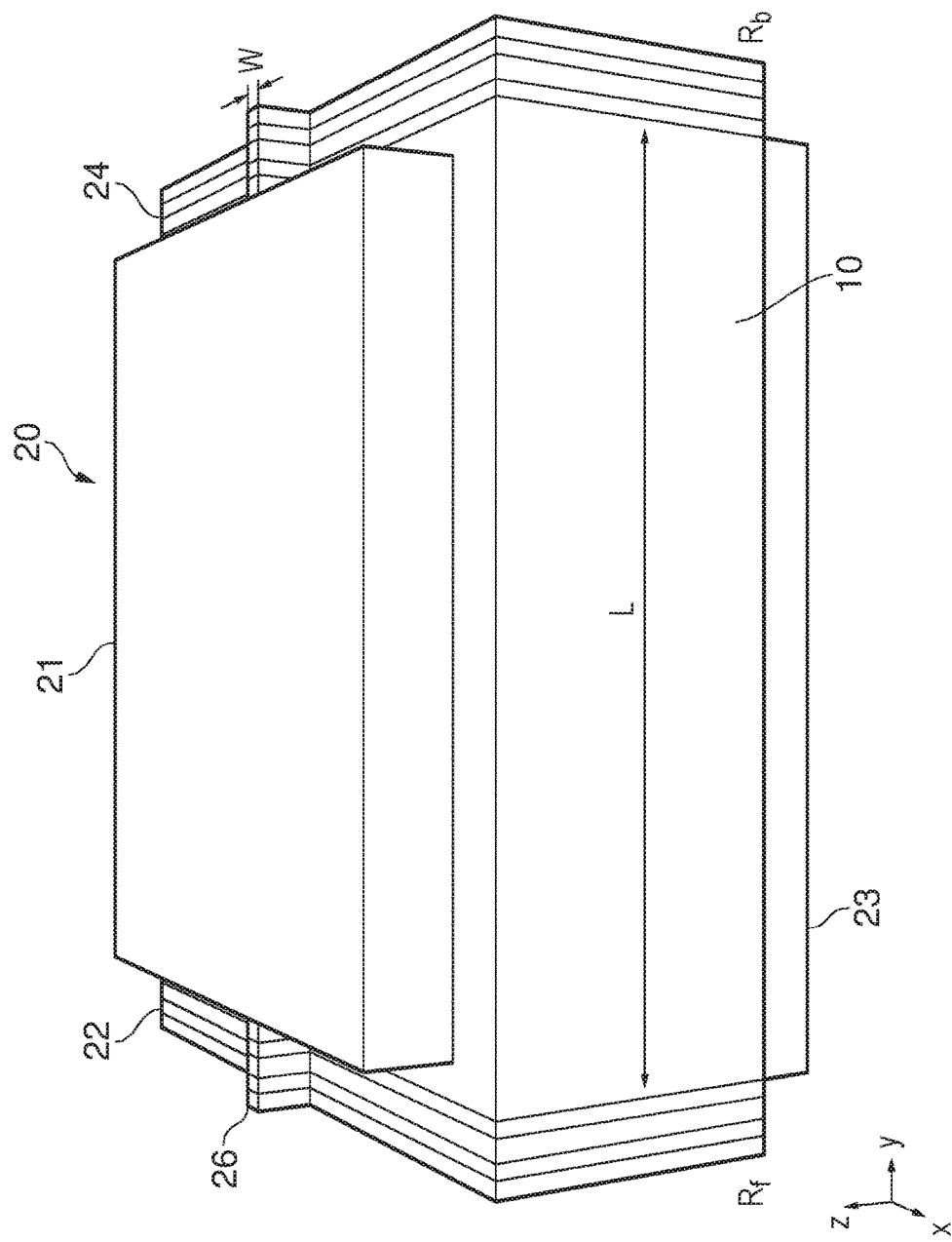
FIG. 3 is a schematic perspective drawing of an edge-emitting LD of the ridge type.

FIG. 3 is a schematic perspective drawing of an edge-emitting LD 20 of the ridge type, referred to in the following as a ridge LD, which incorporates the semiconductor heterostructure 10 of FIG. 2. An edge-emitting LD is so called, since the light is emitted with an optical axis in the plane of the active layer of the semiconductor heterostructure out of a side facet of the device structure. The semiconductor heterostructure 10 of FIG. 2 is shown in FIG. 3, but without showing the individual layers. The semiconductor heterostructure 10 has a length L in the y-direction between opposed mutually parallel cleaved end facets lying in the xz-plane. In the vertical stack direction (z-direction), the semiconductor layer structure 10 is bounded by a metallic top contact electrode 21 and a metallic bottom contact electrode 23 respectively contacting the p-type layers and n-type substrate. In one lateral direction (y-direction), the active layer (not shown) of the semiconductor layer structure 10 is bounded by a front reflector (i.e. mirror) 22 and a rear or back reflector (i.e. mirror) 24. The front and back reflectors 22 and 24 thus form the output coupler and high reflector respectively of the laser cavity. Moreover, the part of the active layer between the reflectors 22 and 24 forms the gain medium where population inversion is induced through injecting carriers via the pn-junction, which then recombine across the band gap generating photons of the desired wavelength. The principal optical axis of the laser is thus in the y-direction. Each reflector 22, 24 is schematically illustrated as being a multi-layer which would be a typical construction. Namely, the mirror materials would be deposited onto the end facets of the semiconductor structure using a vapour deposition technique. That is the front and back reflectors are formed from cleaved facets of the crystal which are perpendicular to the surface of the device, and these end facets are coated with high reflection dielectric mirrors to form the reflectors. The reflectivities of the front and back reflectors 22 and 24 are denoted $R_f$ and $R_b$ respectively.

Also apparent is that the semiconductor layer structure 10 has been etched away on its upper surface to form an exposed ridge 26 of width W (and length L), where the purpose of the etching is to bring the active layer (not visible in FIG. 3) sufficiently close to the surface to achieve good lateral optical confinement perpendicular to the ridge direction, i.e. in the x-direction, so as to form a linear waveguide, i.e. the gain material in the laser cavity, but not so close to the surface that scattering losses become significant.

For the active layer(s) to form the desired elongate waveguide, the intended waveguide material is bounded in the stack direction (z-direction) by areas of lower refractive index. The vertically adjacent parts of the p-type and n-type layers are given a lower refractive index than the active layer by a suitable material choice in a heterostructure.

Ridge LDs are used for green and blue emitters in particular. (For red emitters, edge-emitting LDs are also used as well as vertical cavity surface emitting lasers (VC-SELs), which are also LDs, but with the principal optical axis orthogonal to the layers which makes up the semiconductor heterostructure.) The dominant materials system for current blue or green LDs is based around gallium nitride and related materials, principally those in which gallium is partially or wholly substituted with aluminium and/or indium in the quaternary system GaAlInN.

Gallium nitride and related semiconductor compounds have a Wurtzite crystal structure, which is hexagonal with the hexagonal axis being referred to as the c-axis, or {00-01} in the usual notation. The plane perpendicular to the c-axis is referred to as the c-plane. The substrate orientation can be in the c-plane, which is polar, or some other plane where the polarity is reduced or eliminated, referred to as semi-polar (SP) or non-polar (NP) orientations respectively. Example NP planes are the a-plane {11-20} and m-plane {10-10}. Example SP planes are {11-22} and {20-21}. The advantage of reducing or eliminating the polarity is that any subsequent Wurtzite layers which are not lattice-matched and pseudomorphic with the substrate will have their electric polarization fields reduced or eliminated. The Wurtzite crystal orientation in relation to the LD structure can therefore have different permutations depending on what is desired. For example, the c-axis may be aligned with the z-axis of FIG. 3 (c-plane structure), or may be aligned with the y-axis (NP structure), or may have some intermediate alignment (SP structure).

It is usual to measure efficiency and other performance characteristics of a LD by various different parameters.

The most fundamental parameter for efficiency from a physics perspective of the semiconductor part of the LD is quantum efficiency (QE), namely the percentage of photons emitted per the number of electron-hole pairs that should be generated in the pn-junction assuming that all the drive current is converted into such electron-hole pairs. QE can be subdivided into the efficiency with which photons are coupled out of the laser structure (light extraction efficiency) and the efficiency with which photons are generated in the gain medium from the drive current (internal quantum efficiency). In turn, the internal quantum efficiency is the product of radiative efficiency and current injection efficiency (usually referred to as $\eta_{inj}$). Current injection efficiency is the percentage of drive current that results in electron-hole pairs being injected into the gain medium. Radiative efficiency is the percentage of those electron-hole pairs which reach the gain medium that recombine as desired to create a photon of the desired wavelength.

Separately from this discussion of quantum efficiency, the cavity in any laser will have losses arising from the mirrors and from the gain medium, where mirror losses are to a large extent a design choice, i.e. dictated by the choice of reflectivities of the end mirrors, whereas losses from the gain medium are 'real' losses caused by intrinsic properties of the material used for the gain medium, such as scattering or absorption at the lasing wavelength. The fact that the laser is emitting constitutes a loss, so the existing of the 'leaky' output coupler mirror constitutes a loss of photons which would otherwise continue circulating in the cavity. Moreover, the gain medium itself will cause loss of photons through various diverse physical effects which may be more or less prevalent depending on the nature of the gain medium. Examples are photon absorption (by the crystal lattice in our case) or scattering out of the cavity. The gain medium losses are usually called internal losses and denoted $\alpha_i$. Internal losses $\alpha_i$ are typically of the order of ones to low tens of inverse centimeters (say 5-30 cm$^{-1}$). Lower mirror losses and higher internal losses $\alpha_i$ mean that more drive current is needed to achieve a given increase in power, that is the so-called "slope efficiency" is reduced, i.e. the optical output power to input drive current ratio.

Commercially, what is most important is wall-plug efficiency (WPE) which as well as the QE incorporates any other losses that may occur. Namely, WPE is the ratio of output optical energy of the laser to input electrical energy, i.e. from the mains supply at the "wall plug". Although in principle WPE should include all system losses, including for example power supply losses, powering of coolers, losses in output coupling optics and so forth, usually WPE is defined more narrowly in terms of the LD itself without peripherals, as the ratio of output optical power from the LD (without any optics other than the cavity mirrors) and input electrical power to the laser diode (i.e. excluding any electrical power consumption or losses external to that). We adopt this common usage in the present document.

We also note that in the present document electrical power consumption is generally referred to as power consumption and is the product of the drive current I (assumed to be CW, i.e. not pulsed, unless otherwise stated) and the applied voltage V across the LD.

The schematic drawings of FIG. 2 and FIG. 3 may represent the structure of a blue or a green LD made from the GaAlInN materials system in which one or a multiple number of light emitting, active layers are sandwiched between doped layers of different type. The active layers may contain Ga, Al and In elements in any desired alloy to provide the desired band gaps, refractive indices and other relevant properties in the heterostructure. The p-type layers are arranged above the active layers in the stack, i.e. towards the surface of the device structure. The n-type layers are arranged below the active layers, i.e. in between the light emitting, active layers and the substrate. The substrate may be a c-plane free-standing GaN substrate, or a GaN substrate of a non-polar or semi-polar orientation. Both n-type and p-type layers may contain different molar percentages of the substitutional elements Al, In and Ga to provide the desired band gaps, refractive indices and other relevant properties in the semiconductor heterostructure.

Alternatively, the schematic drawing of FIG. 2 and FIG. 3 may represent the structure of a red LD made from the GaAlInAsP materials system. The body of the red LD can be made of one or a multiple number of light emitting layers that are sandwiched between doped layers of different type. The active layers may contain In, Ga and P elements in any desired alloy to provide the desired band gaps, refractive indices and other relevant properties in the semiconductor heterostructure. The p-type layers are arranged above the active layers, i.e. towards the surface of the device structure. The n-type layers are arranged below the active layers, i.e. in between the light emitting, active layers and the substrate, for example a GaAs substrate. Both the n-type and p-type layers may contain Al, In, Ga, P elements in any desired alloy to provide the desired band gaps, refractive indices and other relevant properties in the heterostructure.

FIG. 4 is a schematic perspective view of an RGB light module 5. The light module 5 has a unitary construction and includes red, green and blue emitters 6, 7 and 8, arranged side by side on a common circuit board 9 with a common n-electrode 17, which may or may not involve the different LDs having a common n-electrode. Alternatively, individual n-electrodes may be provided. Each emitter 6, 7 and 8 has its own p-electrode 11r, 11g and 11b respectively which is contacted by respective drive wire bridges 28r, 28g and 28b connected to p-drive pads 30r, 30g and 30b. The light emitted from each LD is schematically shown as being in a cone with a certain solid angle. It will be understood that micro-lenses, optical fibres and other optical components may be coupled to the light module to form whatever output is desired.

Although a plethora of parameters define the performance of a ridge LD, we focus on the parameter space defined by varying the following parameters in the present document:

| Parameter | Symbol | Unit | Type |
|---|---|---|---|
| Cavity Length | L | m | geometric |
| Ridge width | W | m | geometric |
| Back reflector reflectivity | $R_b$ | % | physical |
| Front reflector reflectivity | $R_f$ | % | physical |
| Internal loss of gain medium | $\alpha_i$ | $m^{-1}$ | physical |

The general effect of varying these parameters is known and is as follows:

The slope efficiency increases when shrinking the cavity length L;

The slope efficiency increases when increasing the mirror losses (decrease Rf);

The threshold current density decreases when decreasing the mirror losses (increase Rf), The slope efficiency decreases when increasing internal losses $\alpha_i$;

The threshold current density increases when increasing the internal losses $\alpha_i$;

The threshold current density increases when shrinking the cavity length L;

The operating current decreases for smaller L and W;

The device series resistance increases for smaller L and W.

It is thus clear that the parameter space is complex and that suitable device characteristics for the desired stable, low power usage can only be achieved through a careful choice of the design parameters mentioned above.

We note that in the examples below (and the brief description of the drawings above), if not stated, then the back reflectivity Rb=100%, current injection efficiency $\eta_{inj}$=0.95 and internal loss $\alpha_i$=7 cm−1. These values are chosen since they show device performance which puts the invention into effect. However, these values are not limitative. For example, current injection efficiencies closer to unity (i.e. 1) will also show suitable device performance and may be desirable.

A first set of related example LDs embodying the invention is now discussed with reference to FIGS. 5A to 10C. These examples relate to blue emitters, but the same design considerations can be applied to green and red emitters, which differ from each other principally only in the band gap engineering used to vary the principal recombination wavelength in the active layers.

Figure 5A:
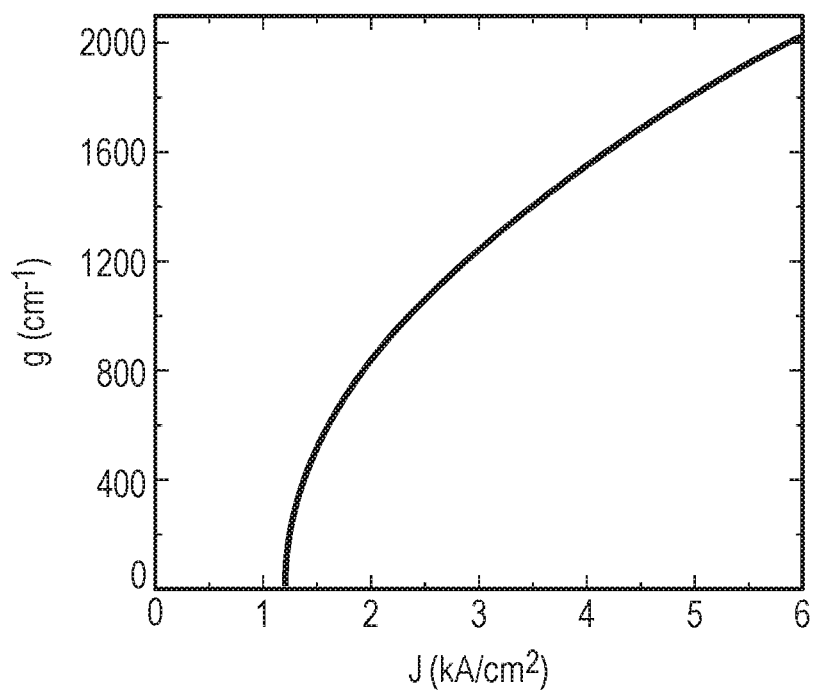
FIG. 5A is a plot of material gain vs. current density for an example GaN-based blue LD embodying the invention.

FIG. 5A is a plot of material gain 'g' vs. current density 'J' for an example GaN-based blue LD embodying the invention.

Figure 5B:
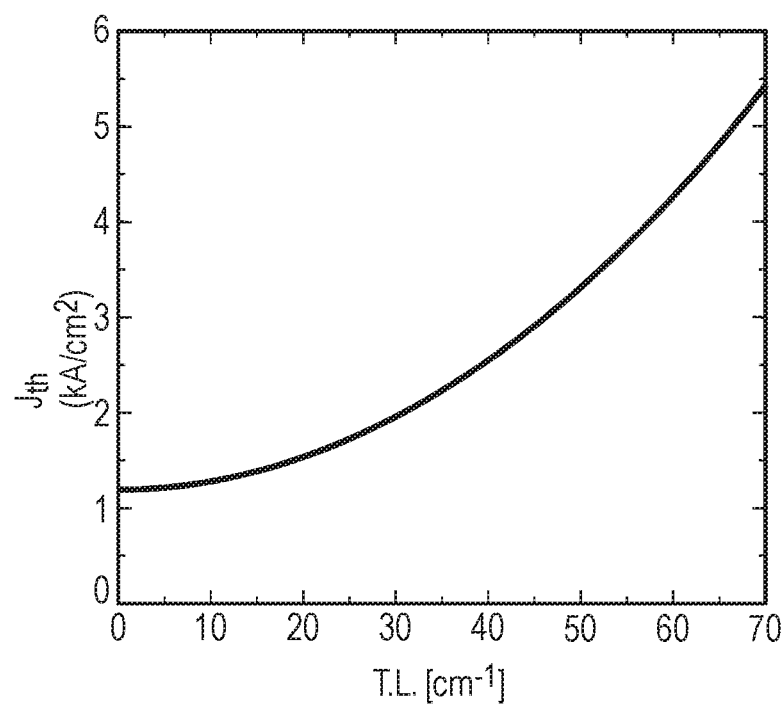
FIG. 5B is a plot of threshold current density vs. total losses (i.e. sum of internal losses and mirror losses) for the same example LD as FIG. 5A.

FIG. 5B is a plot of threshold current density 'Jth' vs. total losses 'T.L.' (i.e. sum of internal losses and mirror losses) for the same example LD as FIG. 5A.

FIG. 5A and FIG. 5B are typical gain and threshold curves for a commercial blue LD and also for the proposed LDs. All the data and figures in the following examples are based on a LD having these characteristics.

This blue LD is optimized for low power consumption (P<100 mW) for an optical output power level of 1 mW. Typical values for the internal losses αi are below 10 cm−1. Typical injection efficiency $\eta_{inj}$>90%.

Figure 6A:
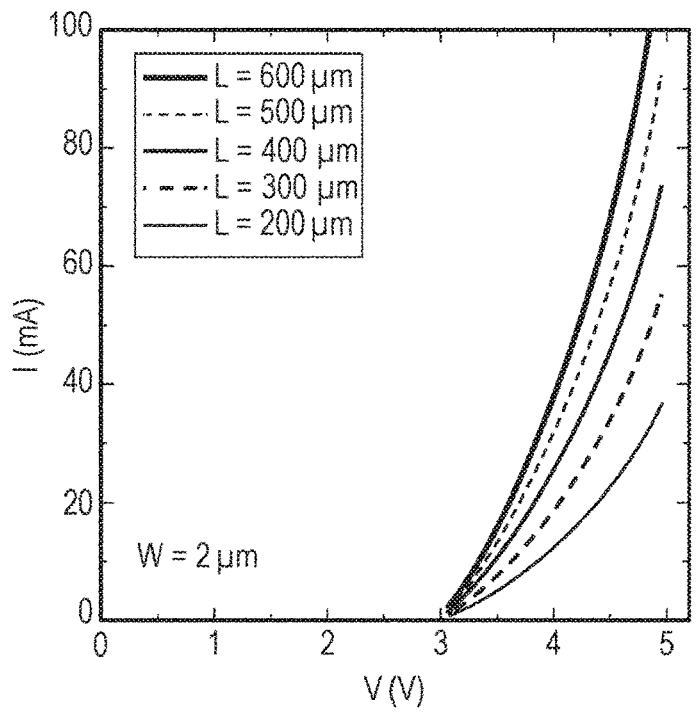
FIG. 6A shows IV-characteristics for GaN-based blue LDs embodying the invention each having a ridge width W=2 µm and varying cavity lengths L=200-600 µm.

FIG. 6A shows a plot of drive current I vs. applied voltage V (IV-characteristics) for GaN-based blue LDs embodying the invention each having a ridge width W=2 μm, but varying cavity lengths L=200-600 μm.

Figure 6B:
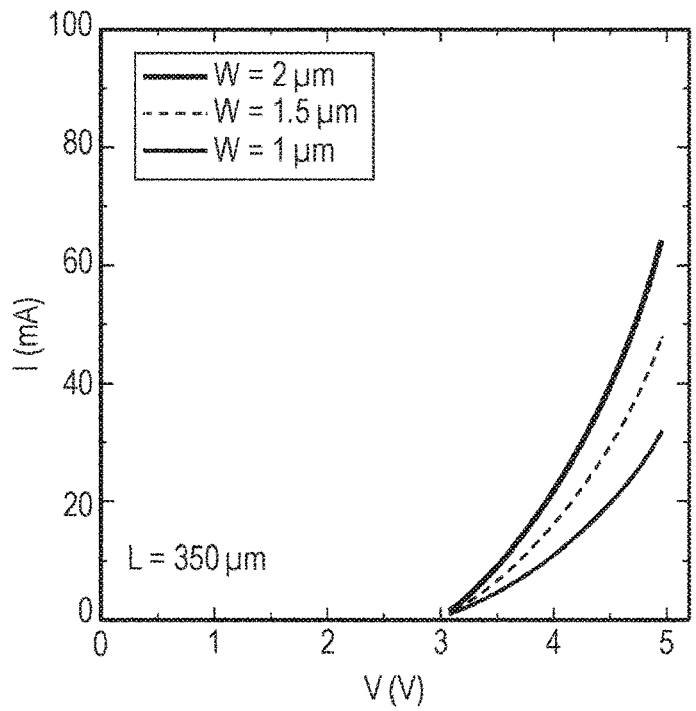
FIG. 6B shows IV-characteristics for GaN-based blue LDs embodying the invention each having a cavity length of L=350 µm and varying ridge widths of W=1, 1.5 and 2 µm.

FIG. 6B shows IV-characteristics for GaN-based blue LDs embodying the invention each having a cavity length of L=350 μm and varying ridge widths of W=1, 1.5 and 2 μm.

Figure 7A:
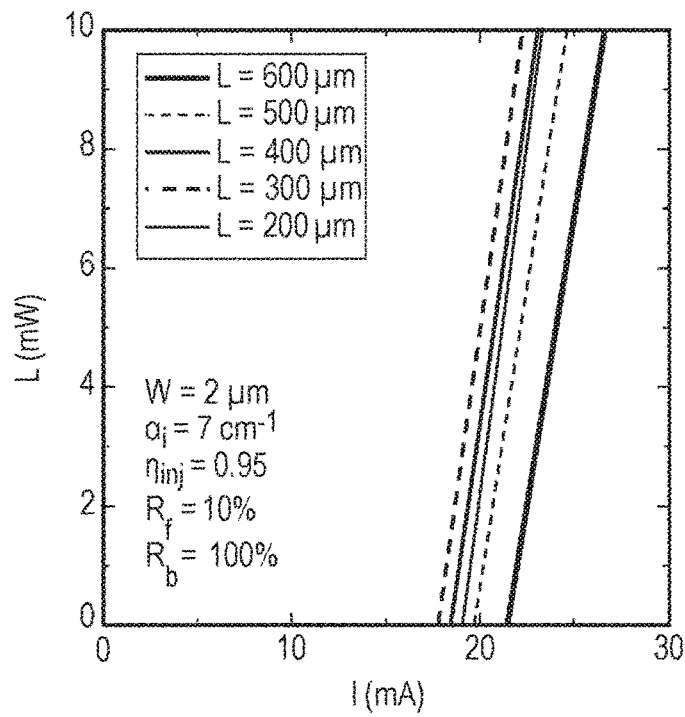
FIG. 7A is a plot of optical output power L vs. drive current I for GaN-based blue LDs embodying the invention, wherein the LDs have varying cavity lengths L=200-600 µm, but otherwise the same parameters.

FIG. 7A is a plot of optical output power L vs. current I for varying cavity lengths L=200-600 µm for GaN-based blue LDs embodying the invention.

Figure 7B:
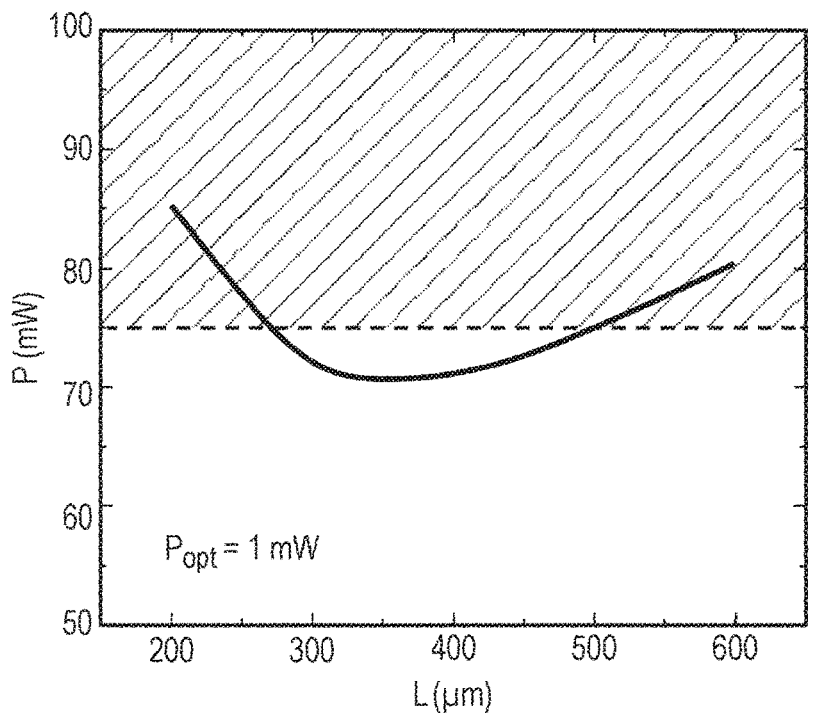
FIG. 7B is a plot of power consumption P vs. cavity length L for a GaN-based blue LD embodying the invention being operated at an output power of 1 mW.

FIG. 7B is a plot if power consumption P vs. cavity length L for GaN-based blue LDs embodying the invention being operated at an output power of 1 mW.

Figure 8A:
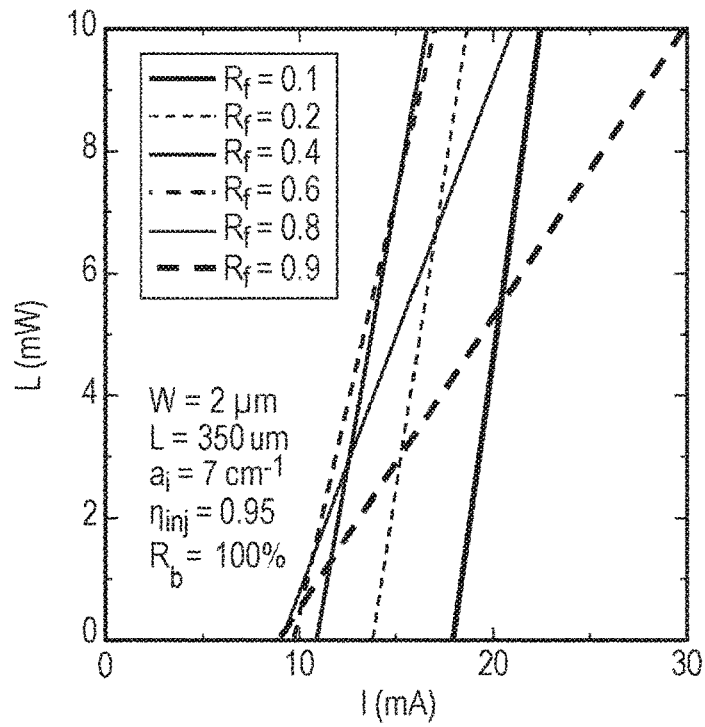
FIG. 8A is a plot of optical output power L vs. current I for GaN-based blue LDs embodying the invention as a function of varying front reflectivity Rf=0.1 to 0.9, but otherwise the same parameters.

FIG. 8A is a plot of optical output power L vs. current I for GaN-based blue LDs embodying the invention as a function of varying front reflectivity Rf=0.1 to 0.9.

Figure 8B:
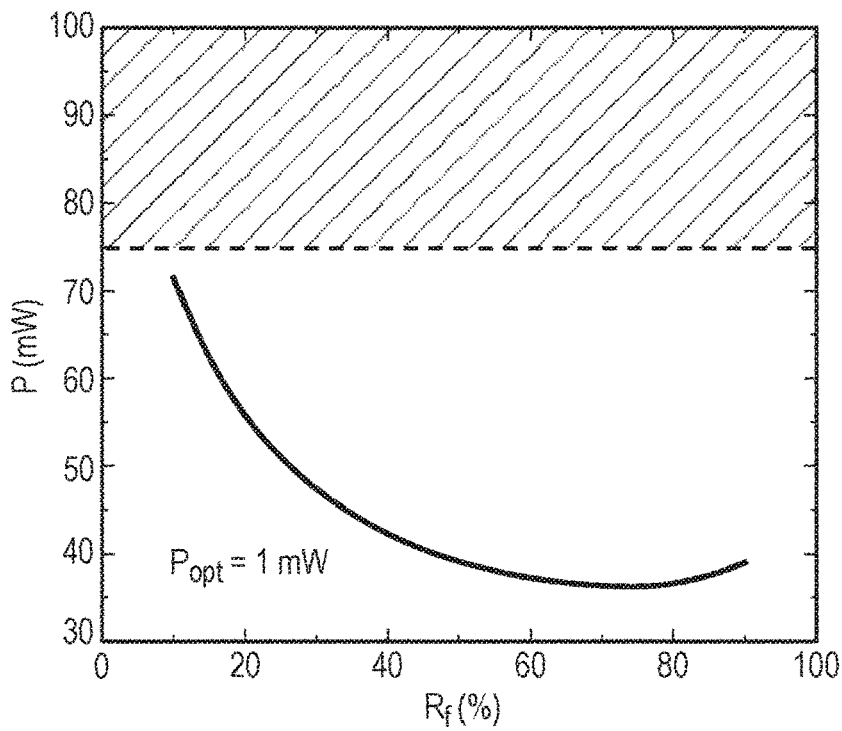
FIG. 8B is a plot of power consumption P vs. front reflectivity Rf for GaN-based blue LDs embodying the invention being operated at an output power of 1 mW.

FIG. 8B is a plot of power consumption P vs. front reflectivity Rf for GaN-based blue LDs embodying the invention being operated at an output power of 1 mW.

Figure 9A:
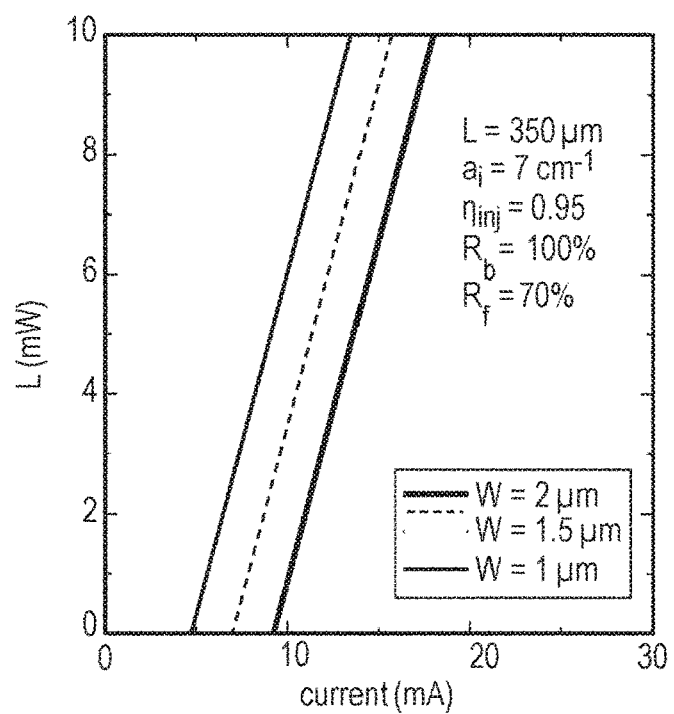
FIG. 9A shows LI-characteristics for GaN-based blue LDs embodying the invention for different ridge widths of W=1, 1.5 and 2 µm.

FIG. 9A optical output power L vs. current I (LI-characteristics) for GaN-based blue LDs embodying the invention for different ridge widths of W=1, 1.5 and 2 µm.

Figure 9B:
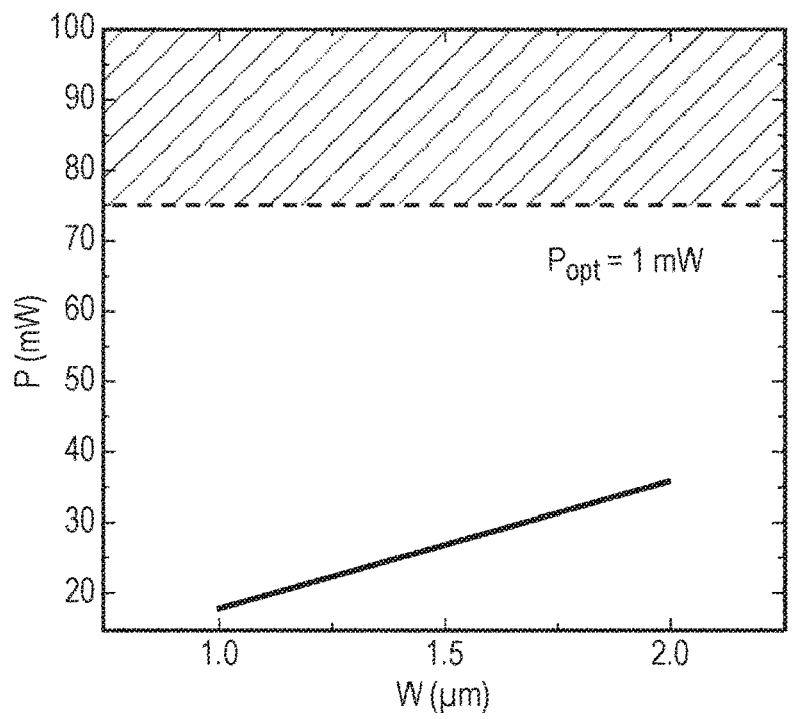
FIG. 9B is a plot of power consumption P vs. cavity length L for GaN-based blue LDs embodying the invention being operated at an output power of 1 mW.

FIG. 9B is a plot of power consumption P vs. cavity length L for GaN-based blue LDs embodying the invention being operated at an output power of 1 mW.

In FIG. 7B, FIG. 8B and FIG. 9B plotting power consumption, the power consumption range of commercially available ridge LDs operating at 1 mW output power are shown by the hatched areas, from which it can be seen that the power consumption in the example designs embodying the invention is 2-5 times lower than the power consumption of otherwise comparable, commercially available ridge LDs.

Figure 10A:
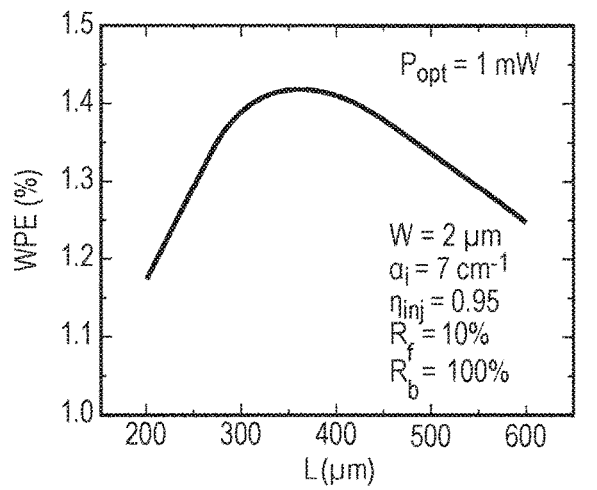
FIG. 10A shows wall plug efficiency WPE as a function of cavity length L for GaN-based blue LDs embodying the invention being operated at an output power of 1 mW and having other design parameters of W=2 µm, $\alpha i$=7 cm−1, $\eta_{inj}$=0.95, Rf=10% and Rb=100%.

FIG. 10A shows wall plug efficiency WPE as a function of cavity length L for GaN-based blue LDs embodying the invention being operated at an output power of 1 mW and having other design parameters of W=2 µm, αi=7 cm−1, $\eta_{inj}$=0.95, Rf=10% and Rb=100%.

Figure 10B:
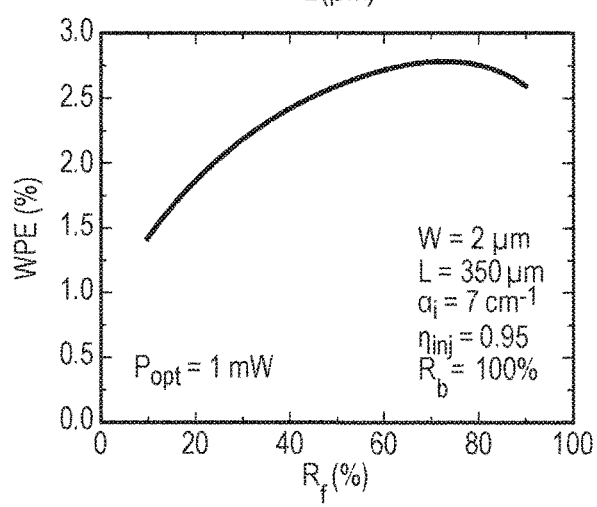
FIG. 10B shows WPE as a function of front reflectivity Rf for GaN-based blue LDs embodying the invention being operated at an output power of 1 mW and having other design parameters of L=350 µm, W=2 µm, $\alpha i$=7 cm−1, $\eta_{inj}$=0.95 and Rb=100%.

FIG. 10B shows WPE as a function of front reflectivity Rf for GaN-based blue LDs embodying the invention being operated at an output power of 1 mW and having other design parameters of L=350 µm, W=2µm, αi=7 cm−1, $\eta_{inj}$=0.95 and Rb=100%.

Figure 10C:
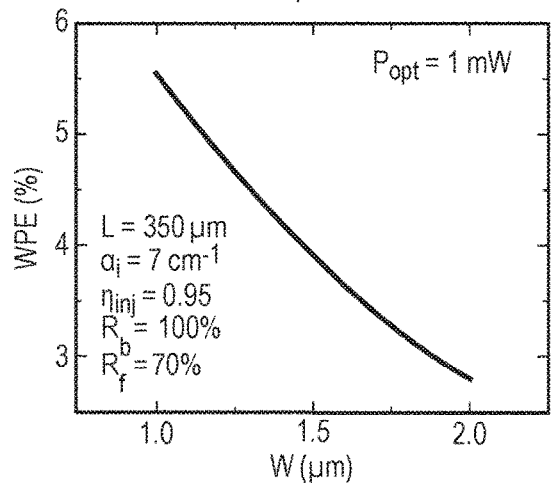
FIG. 10C shows WPE as a function of ridge width W for GaN-based blue LDs embodying the invention being operated at an output power of 1 mW and having other design parameters of L=350 µm, W=2 µm, $\alpha i$=7 cm−1, $\eta_{inj}$=0.95, Rf=70% and Rb=100%.

FIG. 10C shows WPE as a function of ridge width W for GaN-based blue LDs embodying the invention being operated at an output power of 1 mW and having other design parameters of L=350 µm, W=2µm, αi=7 cm−1, $\eta_{inj}$=0.95, Rf=70% and Rb=100%.

From FIG. 10A, FIG. 10B and FIG. 10C, it can be clearly seen that LD embodying the invention with the carefully chosen set of design parameters, in particular L, W and Rf, will operate (and operate stably) at very low power with a few percent wall-plug efficiency, i.e. at efficiencies far below normal WPE values of 20-35%.

Although it might be thought that parameter optimization should keep WPE at reasonably efficient levels of say 20-30% by choosing suitably low values of L and W, and then optimizing front reflectivity Rf, this would not produce a good device. There would be several issues with such an approach. With respect to decreasing L, going below 100-200 µm makes the facet cleaving process increasingly difficult. Facet quality, and hence device performance, would be negatively affected. With respect to decreasing W, for ridge widths below about 1 µm uncontrolled losses in the gain medium are likely to increase leading to degraded performance. Moreover, reducing L and W would also lead to high device electrical resistance.

Instead, we take the approach of ensuring power consumption P is kept below a suitable limit, e.g. below around 100-150 mW, independently of optimising WPE. That is WPE is only optimised within the constraint of having a LD with a power consumption P that is not excessive. As can be seen for the specific example LDs considered in FIGS. 10A, 10B and 10C, this results in WPE values of only around 1-5%.

A second set of related example LDs embodying the invention is now discussed with reference to FIGS. 11A to 13B.

Figure 11A:
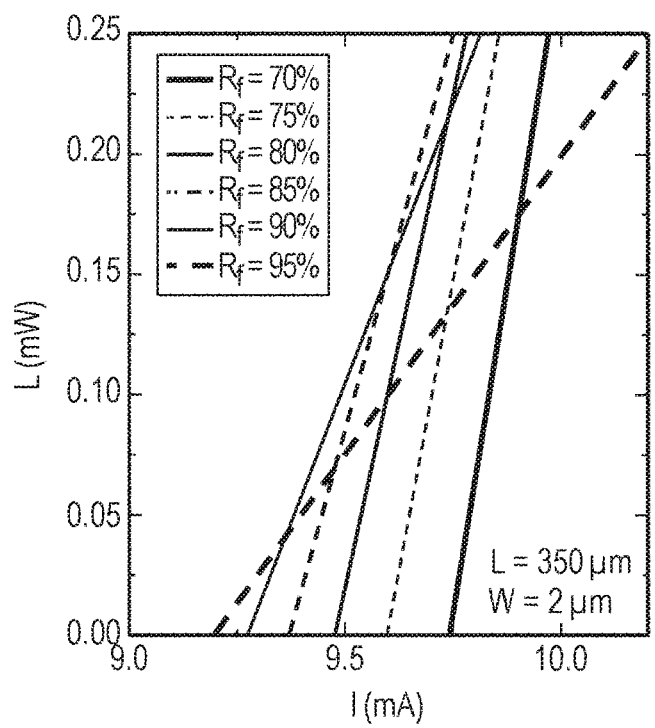
FIG. 11A shows LI-characteristics for GaN-based blue LDs embodying the invention each having L=350 µm and W=2 µm and various different front reflectivities Rf.

FIG. 11A shows optical output power L vs. current I (LI-characteristics) for GaN-based blue LDs embodying the invention each having L=350 µm and W=2 µm and various different front reflectivities Rf.

Figure 11B:
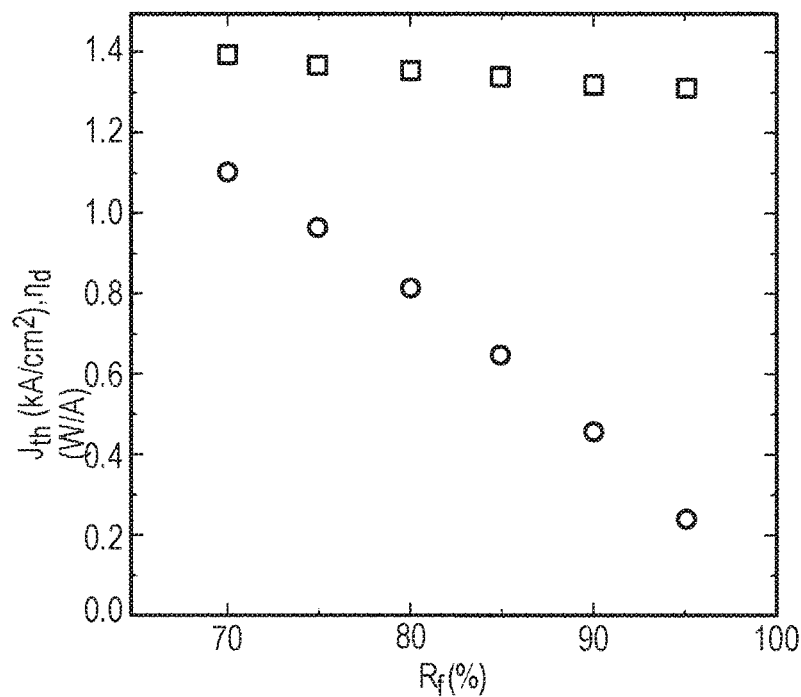
FIG. 11B is a graph plotting threshold current density $J_{th}$ (squares) and slope efficiency $\eta_d$ (circles) for the same example LDs as FIG. 11A as a function of front reflectivity Rf.

FIG. 11B is a graph plotting threshold current density $J_{th}$ (squares) and slope efficiency $\eta_d$ (circles) as a function of front reflectivity Rf for the same example LDs as FIG. 11A.

Figure 12A:
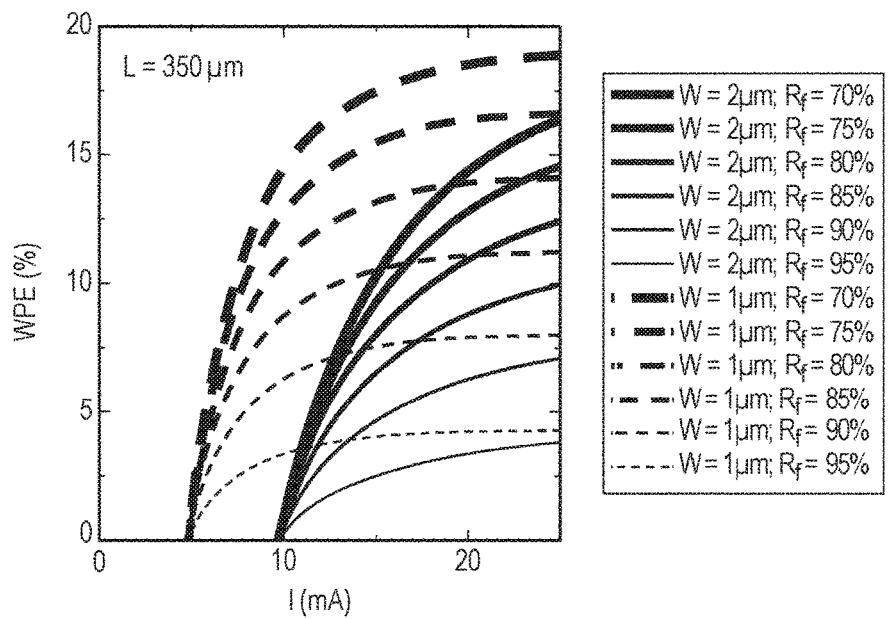
FIG. 12A is a graph of WPE vs. LD drive current I, where the left-hand family of characteristic curves is for W=1 µm and varying Rf, and the right-hand family of characteristic curves is for W=2 µm and varying Rf.

FIG. 12A is a graph of WPE vs. LD drive current I, where the left-hand family of characteristic curves is for W=1 µm and varying Rf, and the right-hand family of characteristic curves is for W=2 µm and varying Rf.

Figure 12B:
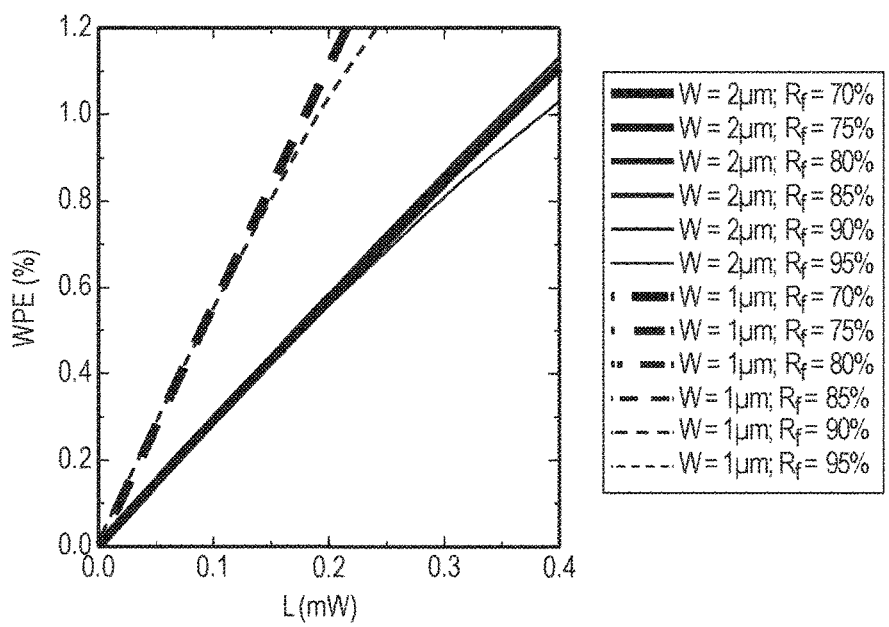
FIG. 12B is a graph of WPE vs. optical output power L for the same example LDs as FIG. 12A, where the group of steeper characteristic curves is for W=1 µm and varying Rf, and the group of shallower characteristic curves is for W=2 µm and varying Rf.

FIG. 12B is a graph of WPE vs. optical output power L for the same example LDs as FIG. 12A, where the group of steeper characteristic curves is for W=1 µm and varying Rf, and the group of shallower characteristic curves is for W=2 µm and varying Rf.

Figure 13A:
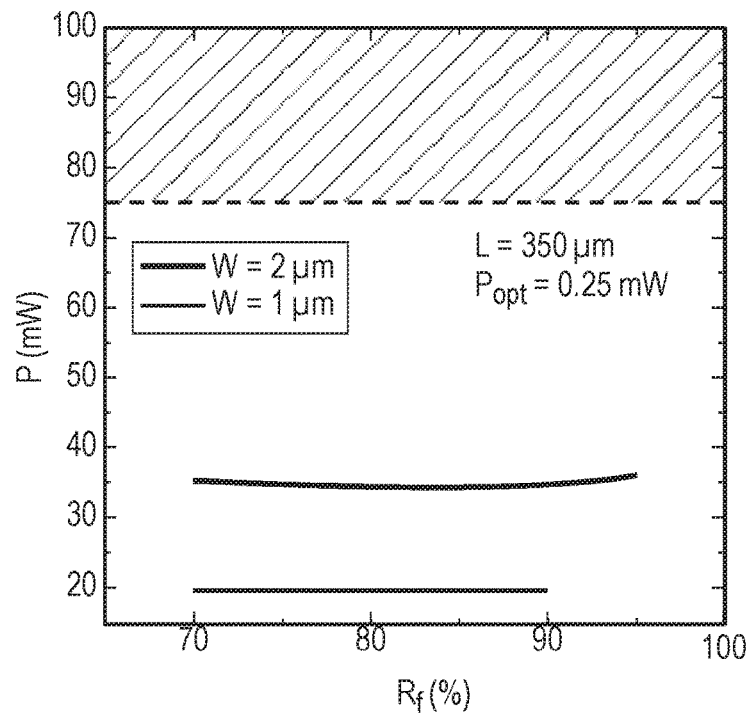
FIG. 13A is a plot of power consumption P as a function of front reflectivity Rf for GaN-based blue LDs embodying the invention being operated at an optical output power of 0.25 mW and having other design parameters of L=350 µm, W=1 or 2 µm.

FIG. 13A is a plot of power consumption P as a function of front reflectivity Rf for GaN-based blue LDs embodying the invention being operated at an output power of 0.25 mW and having other design parameters of L=350 µm, W=1 or 2 µm.

Figure 13B:
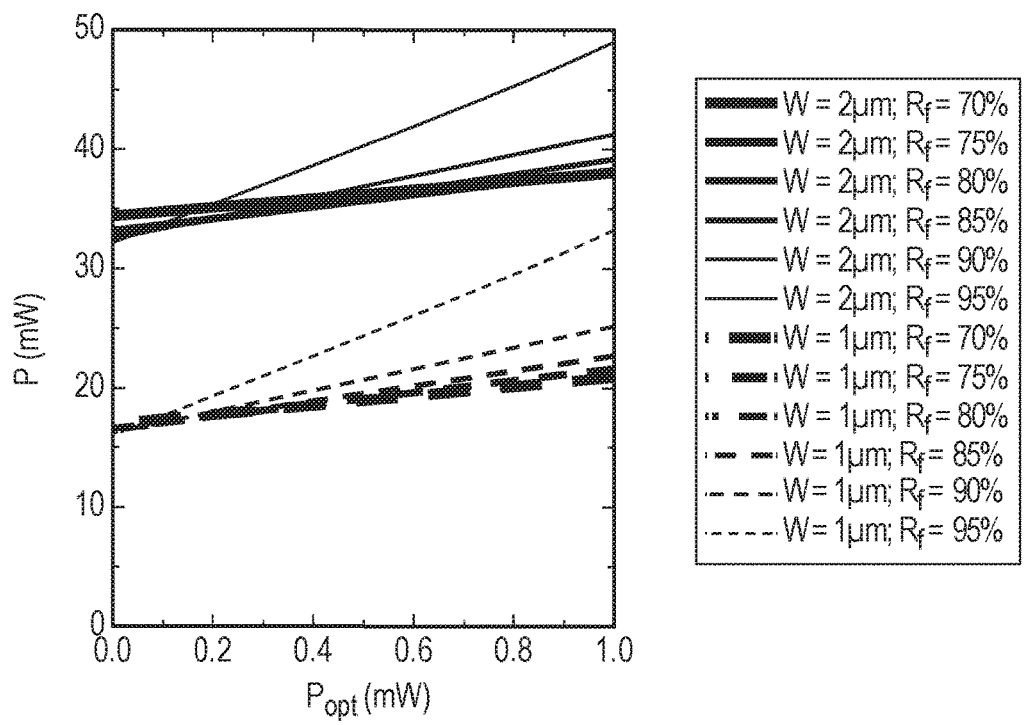
FIG. 13B is a plot of power consumption P as a function of optical output power Pout for the same example blue LDs as in FIG. 13A, with parameters L=350 µm, W=1 or 2 µm, and Rf between 70% and 95%.

FIG. 13B is a plot of power consumption P as a function of output power Pout for the same example blue LDs as in FIG. 13A, with parameters L=350 µm, W=1 or 2 µm, and Rf between 70% and 95%.

As can be seen in FIGS. 11A and 11B, both the threshold current and the slope efficiency reduce with increased front facet reflectivity Rf. Similar to the previous set of examples of FIGS. 5A to 10C, the LDs are operated far from their WPE peak value for both ridge widths of W=1 µm and 2 µm. It is worth noting that, in this power regime, the front facet reflectivity Rf has almost no effect on the WPE and device electrical power consumption, whereas decreasing the ridge width W has a strong impact on those values as can be seen from FIG. 12A, FIG. 12B and FIG. 13A. It is also worth noting that, under the assumption of a high front facet reflectivity (Rf>70%), the power consumption can be kept under the required value (P<100 mW) in a wide range of output powers, as is evident from FIG. 13B. The front facet reflectivity Rf can be then chosen in order to fulfill the other requirements We now discuss some example LDs embodying the invention with reference to FIG. 14A to FIG. 17B showing how optical output power stability can be achieved at low optical output powers.

Figure 14A:
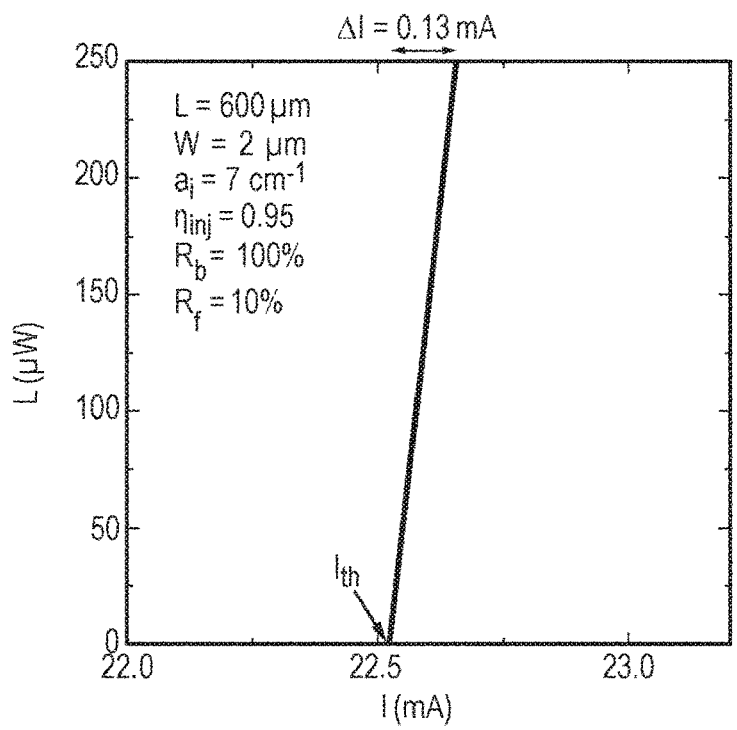
FIG. 14A is an LI-characteristic of a conventional blue LD showing that, from threshold, drive current increases by around 0.13 mA when output power is increased from zero to 250 µW.

FIG. 14A is a graph of optical output power L vs. current I (LI-characteristic) of a conventional blue LD showing that, from threshold, drive current increases by around 0.13 mA when optical output power is increased from zero to 250 µW.

Figure 14B:
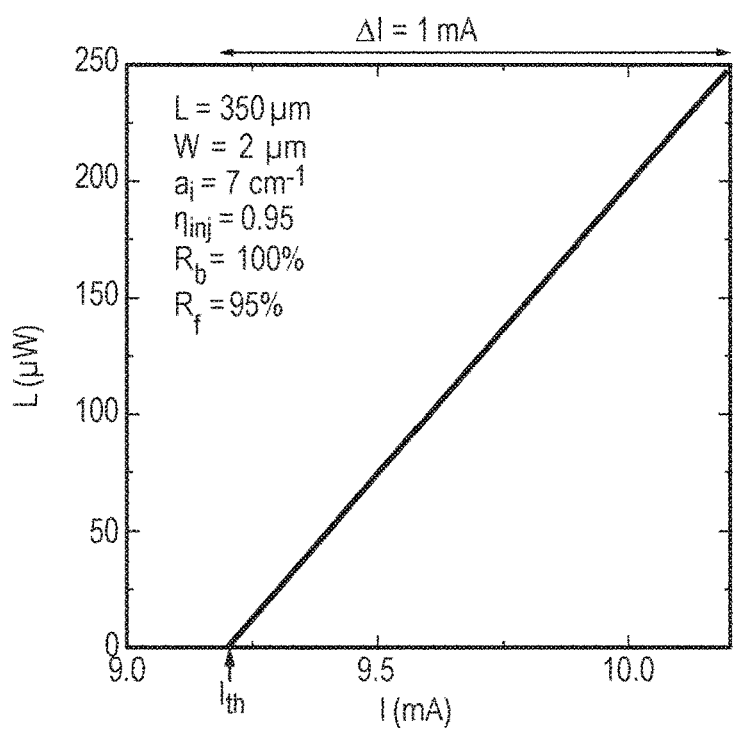
FIG. 14B is an LI-characteristic to be compared with that of FIG. 14A for a blue LD embodying the invention showing that, from threshold, drive current increases by around 1 mA when output power is increased from zero to 250 µW.

FIG. 14B is an LI-characteristic to be compared with that of FIG. 14A for a blue LD embodying the invention showing that, from threshold, drive current increases by around 1 mA when optical output power is increased from zero to 250 µW.

Commercially available GaN-based blue LDs (with a standard design) come with high slope efficiencies of around 2 mW/mA. This is not conducive to stable operation in a low power regime close to threshold, since a small change in drive current will cause a large change in output power. In other words, the high efficiency of conventional LDs is a hindrance to good control at low output powers where the laser is being operated close to the threshold current. Referring to the conventional blue LD shown in FIG. 14A, a current level 0.13 mA above threshold would be required to provide an output power level of 0.25 mW. By comparison, with the proposed designs, the slope efficiency is reduced (most importantly by increasing the front facet reflectivity Rf). This leads to 'poor' slope efficiency which in turn eases low power control, so that stable low power operation can be achieved in both continuous wave and pulsed regimes. It is further noted that power consumption can still be kept to acceptable values of below 100 mW.

The topic of how to achieve power stability is further discussed in relation to the examples of FIGS. 15A to 16B.

Figure 15A:
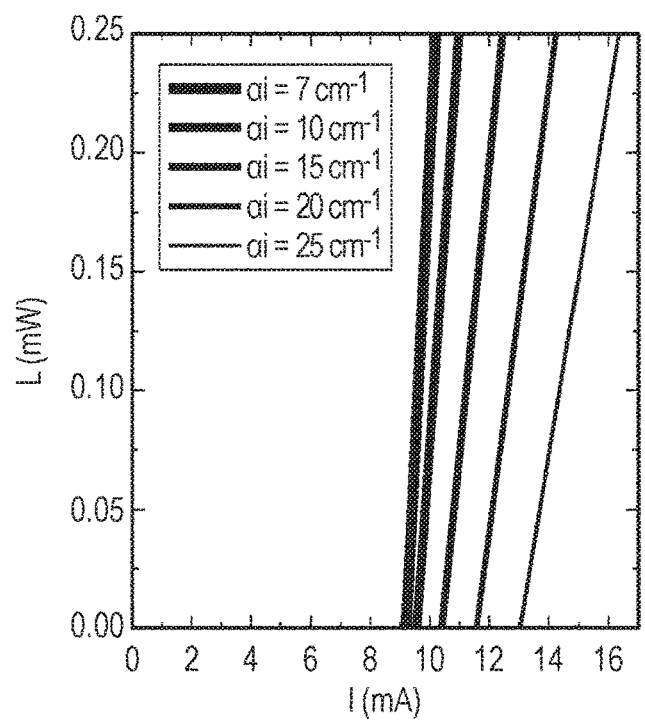
FIG. 15A shows LI-characteristics for various blue LDs embodying the invention which each have L=350 µm, W=2 µm, but different internal losses $\alpha i$.

FIG. 15A shows LI-characteristics for various blue LDs embodying the invention which each have L=350 µm, W=2 µm, but different internal losses αi.

Figure 15B:
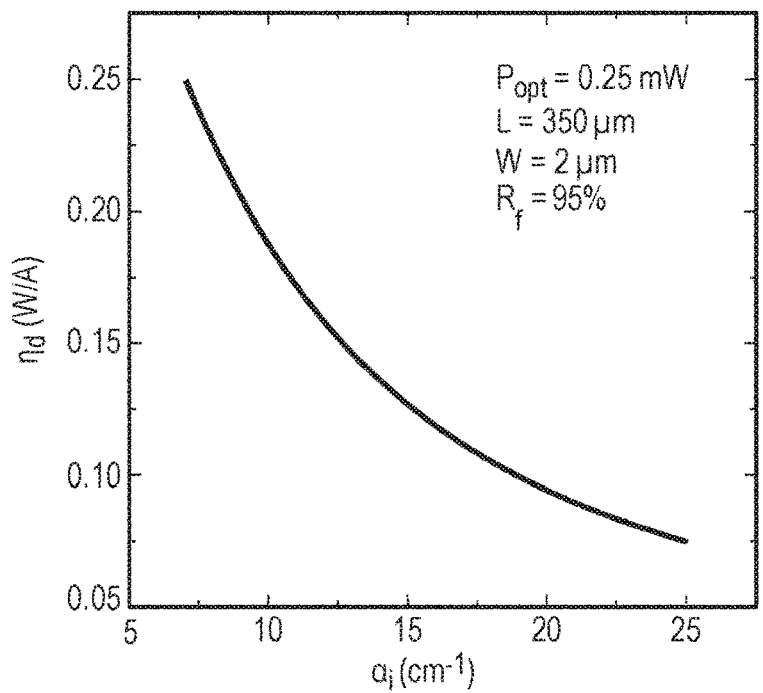
FIG. 15B plots slope efficiency $\eta_d$ for a L=350 µm, W=2 µm blue LD embodying the invention being operated at an output power of 0.25 mW as a function of the internal loss $\alpha i$.

FIG. 15B plots slope efficiency $\eta_d$ for a L=350 µm, W=2 µm blue LD embodying the invention being operated at an output power of 0.25 mW as a function of the internal loss αi.

Figure 16A:
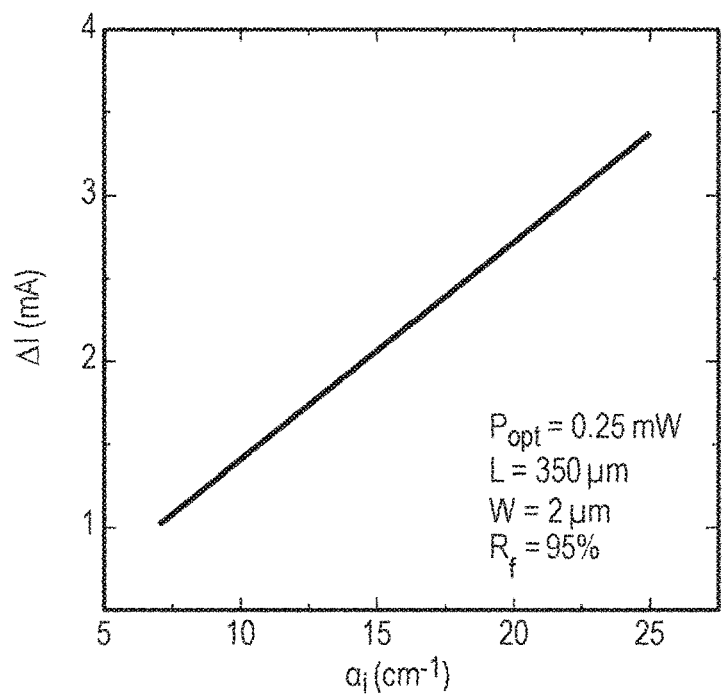
FIG. 16A is a graph showing the drive current above threshold ΔI needed to achieve an output power of 0.25 mW as a function of internal loss $\alpha i$ for blue LDs embodying the invention being operated at an output power of 0.25 mW and having parameters L=350 µm, W=2 µm, and Rf=0.95%.

FIG. 16A is a graph showing the current above threshold ΔI needed to achieve an output power of 0.25 mW as a function of internal loss αi. The parameter ΔI is thus inversely proportional to slope efficiency. This graph shows the effect of intentionally increasing internal loss αi for blue LDs embodying the invention being operated at an output power of 0.25 mW and having parameters L=350 µm, W=2 µm, and Rf=0.95%.

Figure 16B:
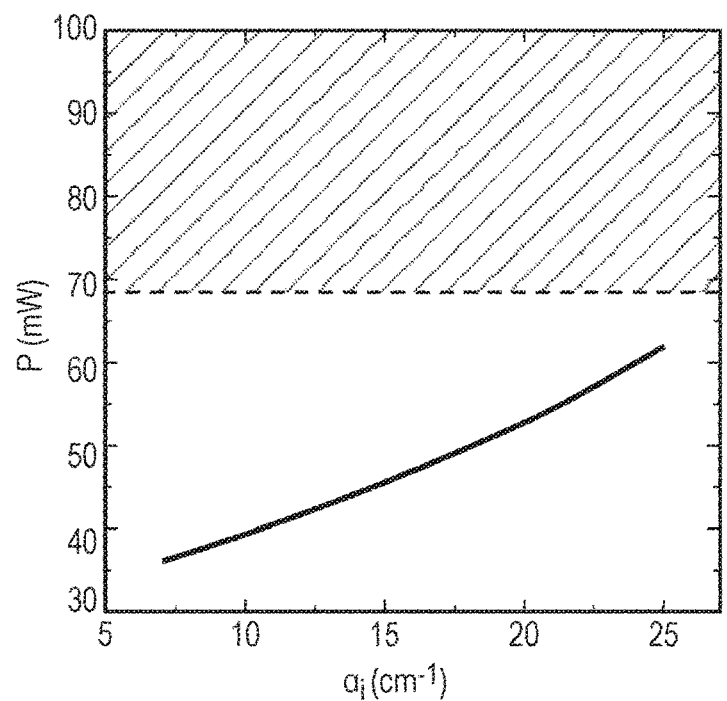
FIG. 16B is a graph showing the effect of intentionally varying internal loss $\alpha i$ on power consumption P for the same example blue LDs as FIG. 16A.

FIG. 16B is a graph showing the effect of intentionally varying internal loss αi on power consumption P for the same example blue LDs as FIG. 16A.

As will be understood from the previous examples, increasing front facet reflectivity Rf is used as a design parameter to lower slope efficiency, which in turn provides more control over power in the low power regime. However, there is a practical limit above which Rf cannot be increased, which is around 95% for the examples we have considered. Above that, the LD may become unstable. If one wishes to reduce slope efficiency without further increasing front reflectivity Rf, then this can be done by intentionally increasing the internal optical loss αi. The internal loss αi can be intentionally increased by introducing in the LD heterostructure an absorbing layer. The absorbing layer can for example be a III-nitride layer, i.e. AlInGaN, and may be doped (e.g. with Mg or Si). Its thickness may also be chosen in order to obtain the desired absorption value. The absorption in this layer will depend on composition, doping and thickness. FIGS. 15A and FIG. 15B show the evolution of the LI-characteristics and of the slope efficiency respectively with different values of internal loss αi. FIG. 16A shows that the drive current above the threshold drive current, ΔI, which is needed to achieve an output power level of 0.25 mW increases as internal loss increases. In this case, the increased power stability is unambiguously achieved at the expense of poorer power consumption. In any case, the power consumption needs to be kept within the power requirement (e.g. P≤100 mW).

Figure 17A:
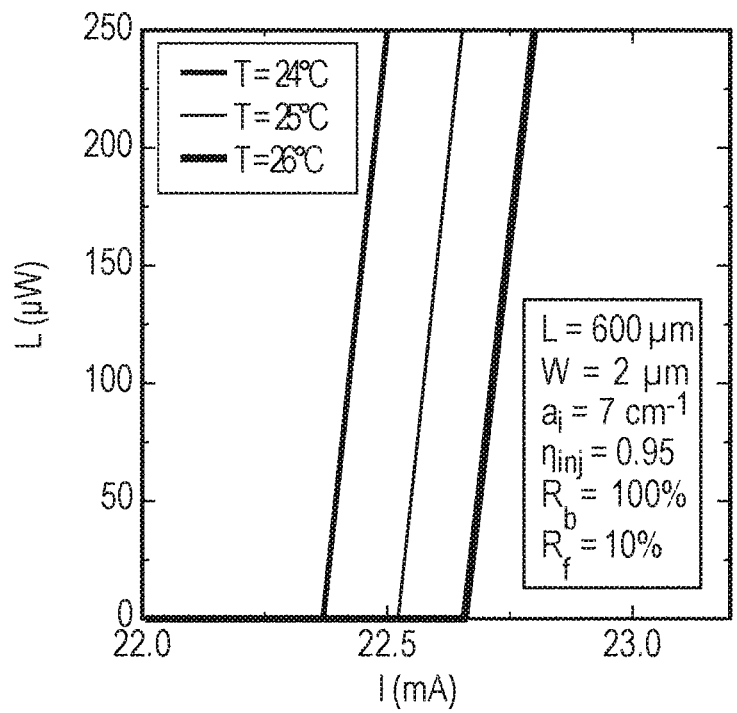
FIGS. 17A and 17B show LI-characteristics with varying temperature in order to compare the temperature stability of a conventional blue LD (FIG. 17A) with that of a blue LD embodying the invention (FIG. 17B).
Figure 17B:
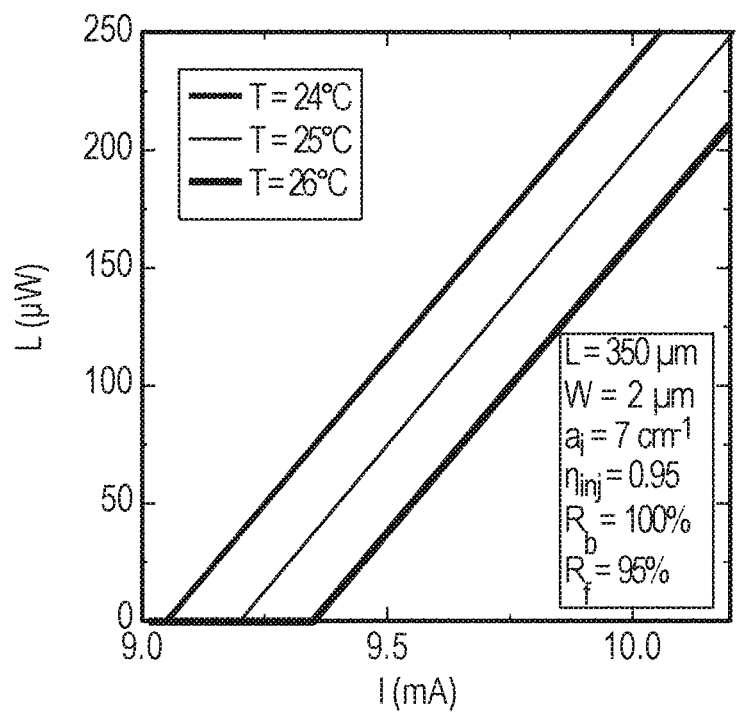

FIGS. 17A and 17B show LI-characteristics with varying temperature to compare the temperature stability of a conventional blue LD (FIG. 17A) with that of a blue LD embodying the invention (FIG. 17B). With the example conventional LD, output power changes by 280 µW/C, whereas for the example LD embodying the invention the value is 37 µW/C, i.e. seven times less. This reduction in sensitivity to temperature variations follows from the decreased slope efficiency in the proposed designs, which directly translates into a lower power variation of the threshold current with temperature.

It is also desirable that a LD has stable output power as a function of temperature, so this should also be the case here for these low output power regimes. We find that temperature stability is significantly better than for conventional LDs.

In summary of the above examples, they show how cavity length L, front facet reflectivity Rf, ridge width W and internal loss αi can be optimized depending on the required power consumption, output power levels requirements and stability over temperature variations. Moreover, it is noted that all the examples reported above apply to the case of a blue edge emitter LD, but are easily extended to green and red sources.

Figure 18:
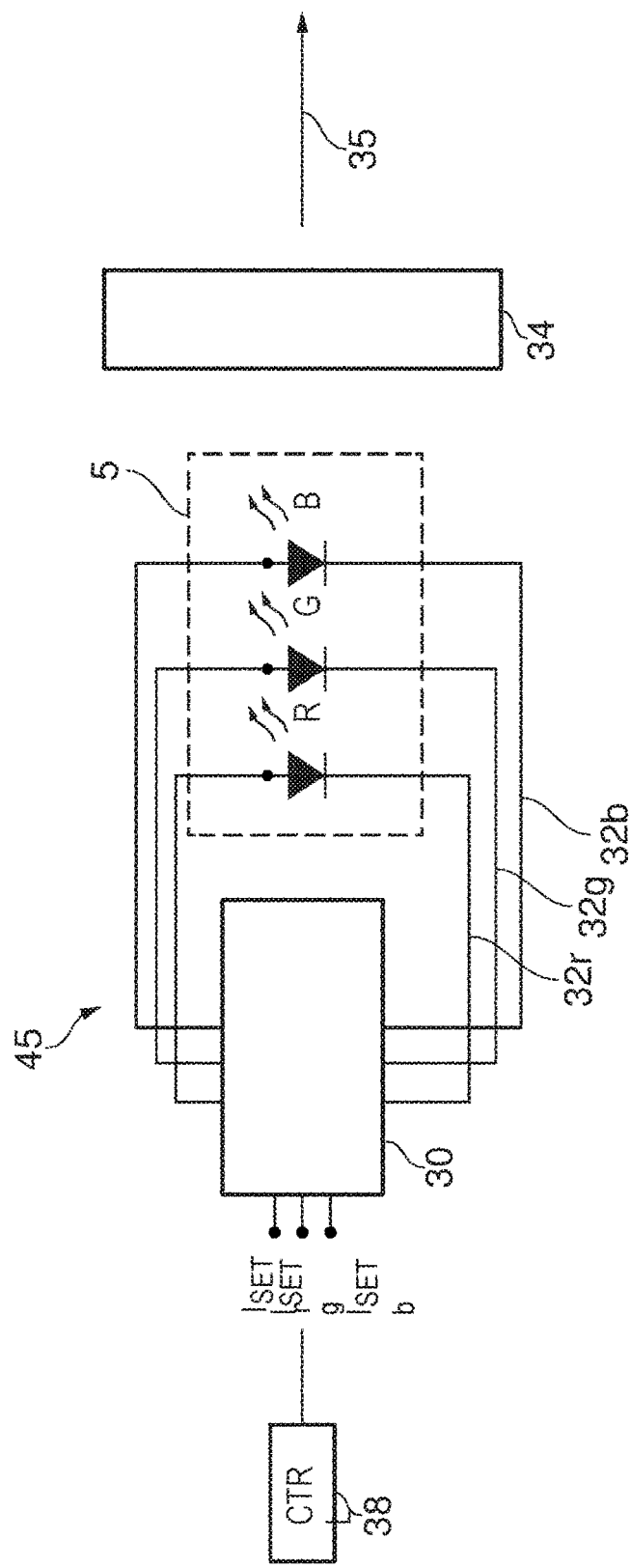
FIG. 18 is a schematic drawing of a drive circuit and other components suitable for integration of an RGB light module embodying the invention as shown in FIG. 4.

FIG. 18 is a schematic drawing of a light source unit 45 including a drive circuit and other components suitable for integration of an RGB light module 5 embodying the invention as shown in FIG. 4. Each of the LDs is driven by respective circuits 32r, 32g, 32b from a driver unit 30 which receives drive currents $I_{SETr}$, $I_{SETg}$, $I_{SETb}$ from a controller 38. The red, green and blue light beams output from the LDs are combined by optical elements 34 into a single RGB light beam 35.

Figure 19:
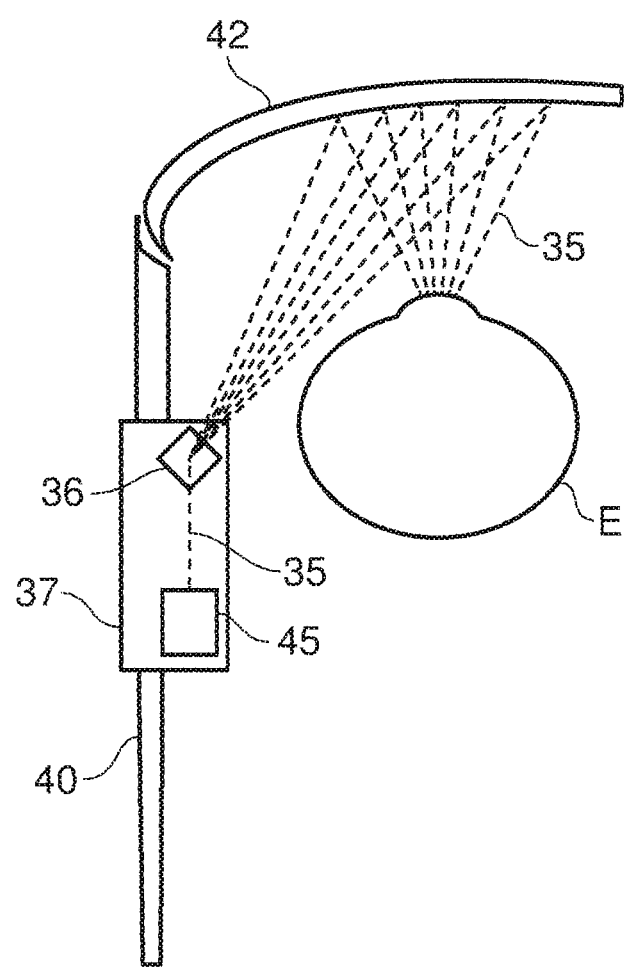
FIG. 19 shows an example direct projection system in a monocle format.

FIG. 19 shows an example direct projection system in a monocle format, i.e. glasses or spectacles for a single eye. A housing 37 is integrated midway along a temple 40 and houses the light source unit 45 of FIG. 18. The combined RGB light beam 35 output by the light source unit 45 is directed to a scanning element 36 which projects an image on the inside surface of a lens 42 which is then reflected onto a wearer's eye E to directly project into the eye. It will be understood that the same basic structure would be suitable for conventional use, where an image is formed on the inside surface of the lens for the wearer to view conventionally. Moreover, it will be understood that the reference to the lens 42 does not imply that the lens 42 has any lensing function insofar as the projection system is concerned, rather it merely serves to provide a reflection surface for direct projection (or projection surface for conventional projection).

Figure 20:
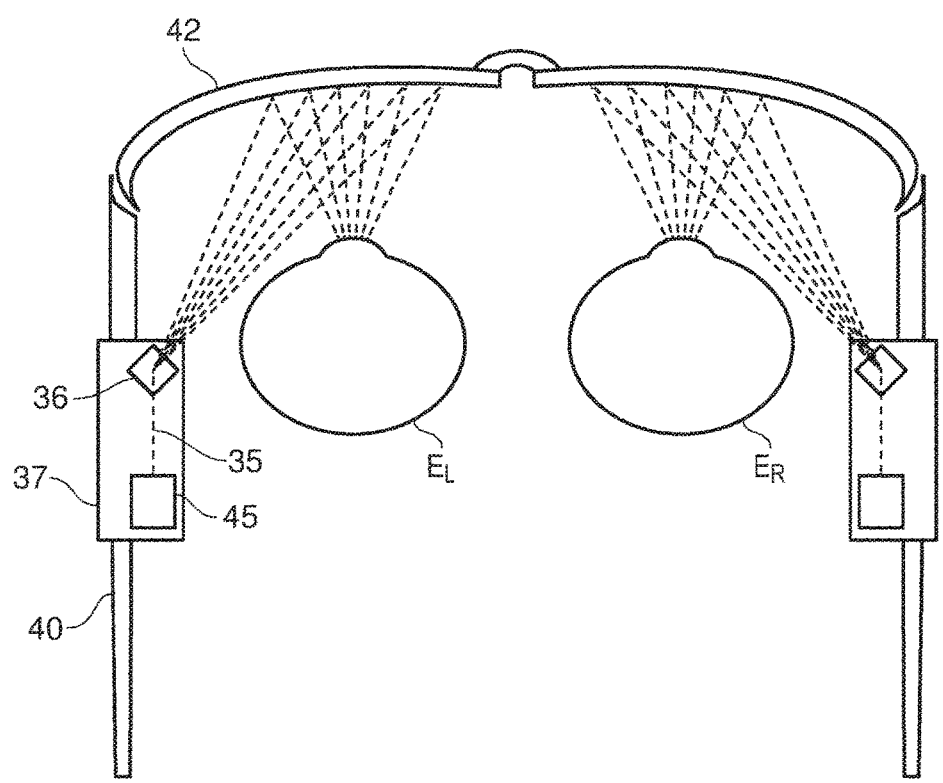
FIG. 20 shows an example direct projection system in a spectacles format.

FIG. 20 shows an example direct projection system in a spectacles format which is essentially a doubled-up version of the single-eye system of FIG. 19 for direct projection into the left eye $E_L$ and right eye $E_R$. The same reference numerals are used. Projection into both eyes allows for additional possibilities, such as stereoscopic imaging for 3D.

What is claimed is:

1. An edge-emitting ridge laser diode comprising:
   a semiconductor heterostructure having an active layer sandwiched between an n-type layer and a p-type layer, wherein the active layer is influenced by a ridge structure to form a gain medium of width W; and
   a back reflector of reflectivity Rb formed on a first side facet of the semiconductor heterostructure and a front reflector of reflectivity Rf formed on a second side facet of the semiconductor heterostructure, wherein the front and back reflectors are spaced apart to form a cavity of length L containing at least a part of the active layer, which thus forms the gain medium with an internal loss αi,
   wherein the width W: 1 µm≤W≤2 µm;
   wherein the cavity length L: 100 µm≤L≤600 µm;
   wherein the internal loss αi: 0 cm−1≤αi≤30 cm−1;
   wherein the back reflectivity Rb: 100≥Rb≥80%; and
   wherein the front reflectivity Rf: 100≥Rf≥60%,
   wherein the laser diode, in an output power range of up to 1 mW, has a characteristic slope efficiency of less than 0.5 mW/mA, where slope efficiency is the ratio of output optical power to input electrical current, and an electrical power consumption below 150mW.

2. The laser diode of claim 1, wherein the back reflectivity Rb is greater than one of 85%, 90% and 95%.

3. The laser diode of claim 1, wherein the front reflectivity Rf is greater than one of 65%, 70%, 75%, 80% and 85%.

4. The laser diode of claim 1, wherein the cavity length L is greater than one of 150 μm, 200 μm, 250 μm and 300 μm.

5. The laser diode of claim 1, wherein the cavity length L is less than one of 400 μm, 450 μm, 500 μm and 550 μm.

6. The laser diode of claim 1 is configured to have a range of ratios of output optical power to input electrical power, referred to as wall plug efficiency, of between 0.5 and 1.5%, or 1 to 5%.

7. The laser diode of claim 1, operable to emit with an output optical power below one of: 5 mW, 1 mW, 500 μW, 300 μW and 100 μW.

8. The laser diode of claim 1, wherein the characteristic slope efficiency, in an output power range of up to 1 mW, is less than 0.3 mW/mA.

9. The laser diode of claim 1, wherein the semiconductor heterostructure includes layers from the GaAlInN materials system.

10. The laser diode of claim 1, wherein the laser diode is configured to emit in the blue, that is at a wavelength from 400-495 nm.

11. The laser diode of claim 1, wherein the laser diode is configured to emit in the green, that is at a wavelength from 495-570 nm.

12. The laser diode of claim 1, wherein the semiconductor heterostructure includes layers from a GaAlInAsP materials system.

13. A light module comprising a first laser diode according to claim 1 and a second laser diode according to claim 1.

14. The light module of claim 13, further comprising a third laser diode, wherein the first, second and third laser diodes are configured to emit in respective colors which collectively provide a three color palette in an additive color model.

15. The light module of claim 14, wherein the third laser diode is a laser diode according to claim 1.

16. A vision system configured to be placed on a human head incorporating a light module according to claim 13.

17. The laser diode of claim 12, wherein the laser diode is configured to emit in the red, that is at a wavelength from 620-750 nm.

18. The laser diode of claim 1, wherein said electrical power consumption in the output power range of up to 1 mW is below 100 mW.

19. A method of operating an edge-emitting laser diode comprising:
a semiconductor heterostructure having an active layer sandwiched between an n-type layer and a p-type layer, wherein the active layer is influenced by a ridge structure to form a gain medium of width W;
a back reflector of reflectivity Rb formed on a first side facet of the semiconductor heterostructure and a front reflector of reflectivity Rf formed on a second side facet of the semiconductor heterostructure, wherein the front and back reflectors are spaced apart to form a cavity of length L containing at least a part of the active layer, which thus forms the gain medium with an internal loss $\alpha i$,
wherein the width W: 1 μm≤W≤2 μm;
wherein the cavity length L: 100 μm≤L≤600 μm;
wherein the internal loss $\alpha i$: 0 cm−1≤$\alpha i$≤30 cm−1;
wherein the back reflectivity Rb: 100≥Rb≥80%; and
wherein the front reflectivity Rf: 100≥Rf≥60%,
wherein the method comprises:
supplying a drive current to the laser diode so as to cause laser emission with an output optical power below one of: 5 mW, 1 mW, 500 μW, 300 μW and 100 μW,
wherein the laser diode, in an output power range of up to 1 mW, has a characteristic slope efficiency of less than 0.5 mW/mA, where slope efficiency is the ratio of output optical power to input electrical current, and an electrical power consumption below 150 mW.

20. The method of claim 19, wherein said electrical power consumption in the output power range of up to 1 mW is below 100 mW.

21. An edge-emitting ridge laser diode comprising:
a semiconductor heterostructure having an active layer sandwiched between an n-type layer and a p-type layer, wherein the active layer is influenced by a ridge structure to form a gain medium of width W;
a back reflector of reflectivity Rb formed on a first side facet of the semiconductor heterostructure and a front reflector of reflectivity Rf formed on a second side facet of the semiconductor heterostructure, wherein the front and back reflectors are spaced apart to form a cavity of length L containing at least a part of the active layer, which thus forms the gain medium with an internal loss $\alpha i$,
wherein the width W: 1 μm≤W≤2 μm;
wherein the cavity length L: 100 μm≤L≤600 μm;
wherein the internal loss and the front and back reflectivities are selected with respective values to provide, in an output power range of up to 1 mW, a characteristic slope efficiency of less than 0.5 mW/mA, where slope efficiency is the ratio of output optical power to input electrical current , and an electrical power consumption below 150 mW.

22. The laser diode of claim 21, wherein the characteristic slope efficiency, in an output power range of up to 1 mW, is less than 0.3 mW/mA.

23. The laser diode of claim 21, wherein said electrical power consumption in the output power range of up to 1 mW is below 100 mW.

* * * * *